United States Patent
Hosaka et al.

(10) Patent No.: US 7,915,661 B2
(45) Date of Patent: Mar. 29, 2011

(54) SEMICONDUCTOR DEVICE AND FABRICATION METHOD THEREFOR

(75) Inventors: Masaya Hosaka, Fukushima-ken (JP); Masatomi Okanishi, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 12/543,404

(22) Filed: Aug. 18, 2009

(65) Prior Publication Data

US 2010/0001333 A1    Jan. 7, 2010

Related U.S. Application Data

(63) Continuation of application No. 11/513,693, filed on Aug. 30, 2006, now Pat. No. 7,589,371, which is a continuation-in-part of application No. PCT/JP2005/015693, filed on Aug. 30, 2005.

(51) Int. Cl.
*H01L 29/76* (2006.01)
*H01L 21/8238* (2006.01)

(52) U.S. Cl. . 257/314; 257/315; 257/330; 257/E21.679; 257/E21.68; 438/201; 438/211; 438/270

(58) Field of Classification Search .......... 438/201, 438/211, 257, 270; 257/315, 314, 330
See application file for complete search history.

(56) References Cited

U.S. PATENT DOCUMENTS

| 6,204,529 B1 | 3/2001 | Lung et al. |
| 6,432,782 B1 | 8/2002 | Lung et al. |
| 2004/0238879 A1 | 12/2004 | Endoh et al. |

FOREIGN PATENT DOCUMENTS

| JP | 6459960 | 3/1989 |
| JP | 2003508914 | 3/2003 |
| JP | 2004356207 | 12/2004 |
| JP | 2005197425 | 7/2005 |

*Primary Examiner* — Hsien-ming Lee

(57) ABSTRACT

The present invention provides semiconductor device and a fabrication method therefor. The semiconductor device includes trenches (11) formed in a semiconductor substrate (10), first ONO films (18) provided on both side surfaces of the trenches, and first word lines (22) provided on side surfaces of the first ONO films (18) and running in a length direction of the trenches (11). According to the present invention, it is possible to provide a semiconductor device and a fabrication method therefor, in which higher memory capacity can be achieved.

26 Claims, 23 Drawing Sheets

FIG. 3A
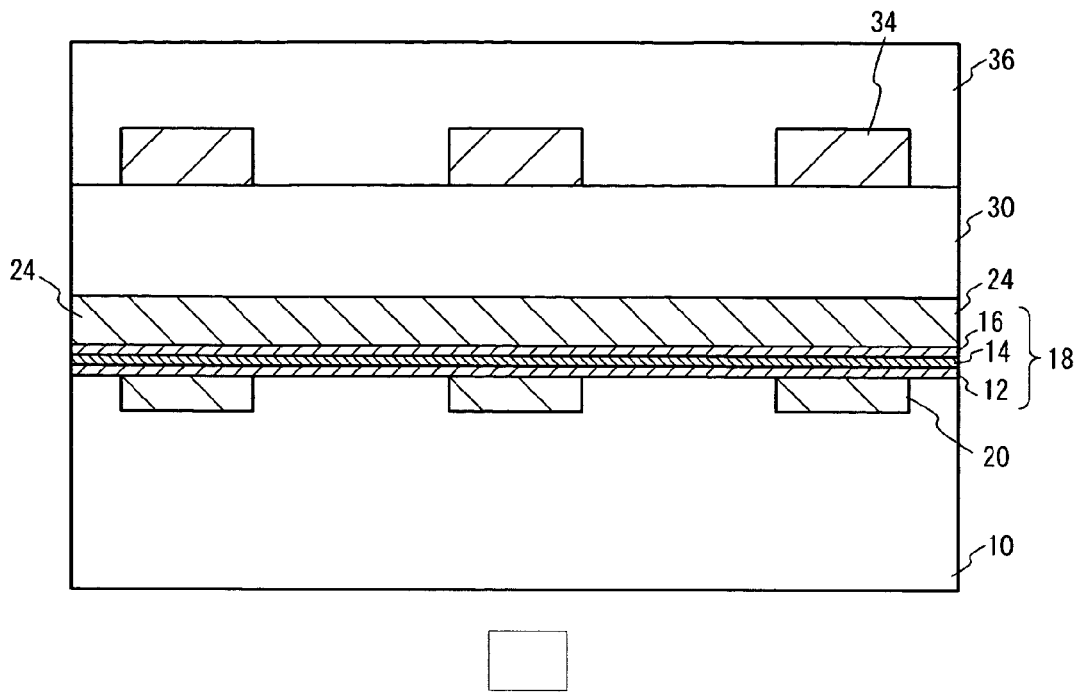
FIG. 3B
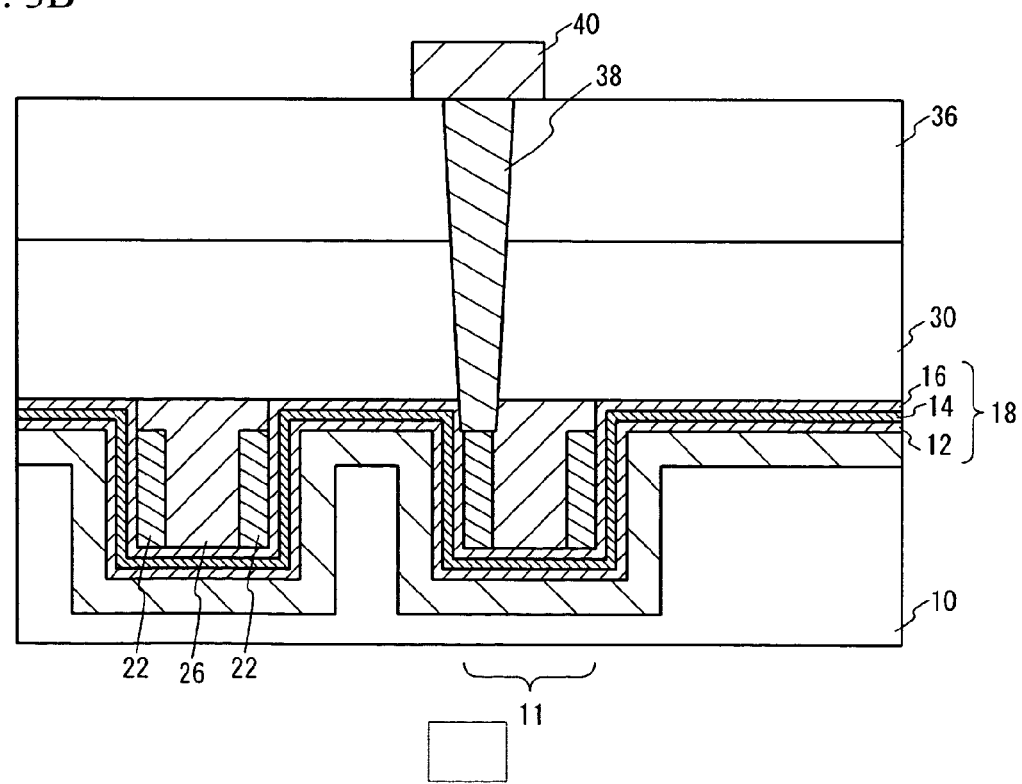

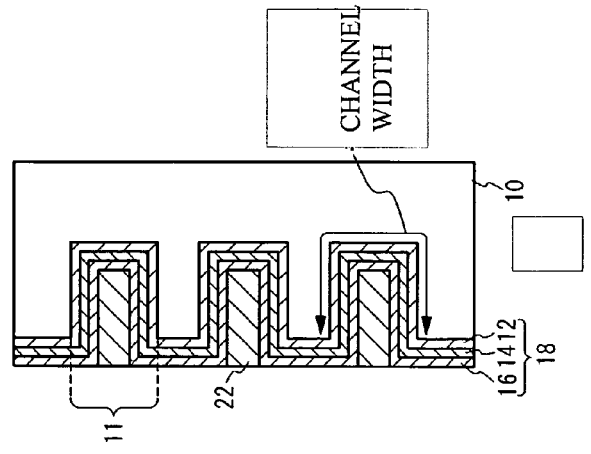
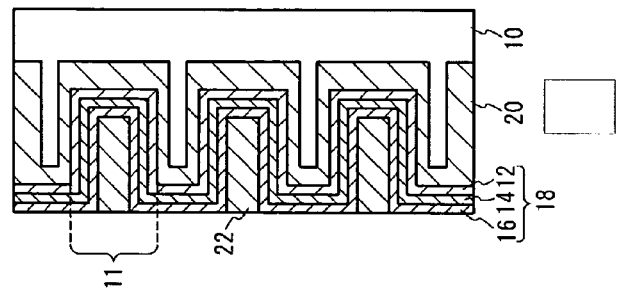
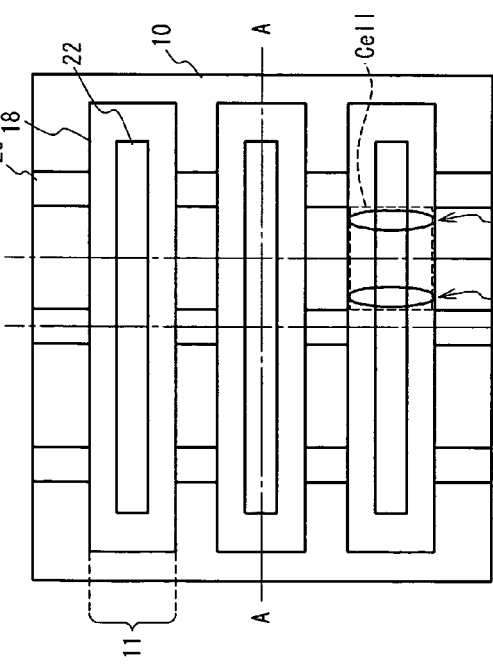
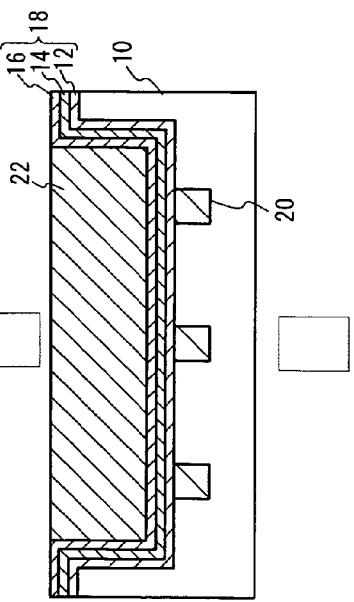

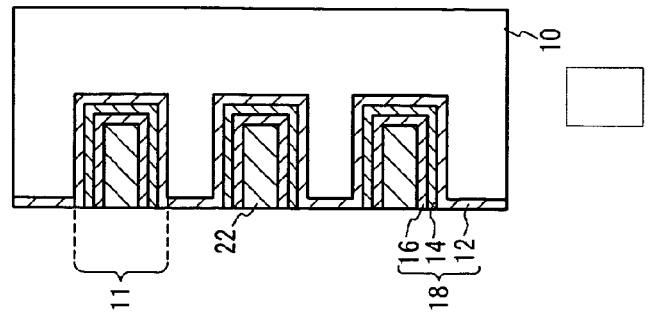
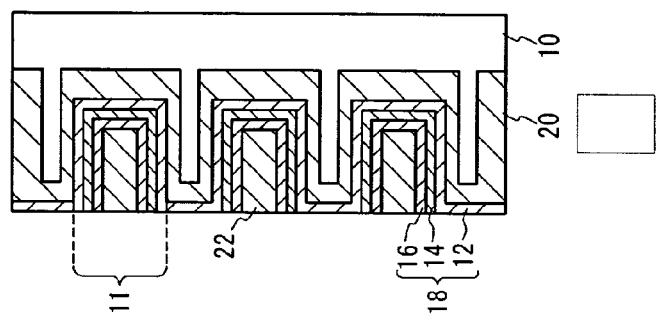
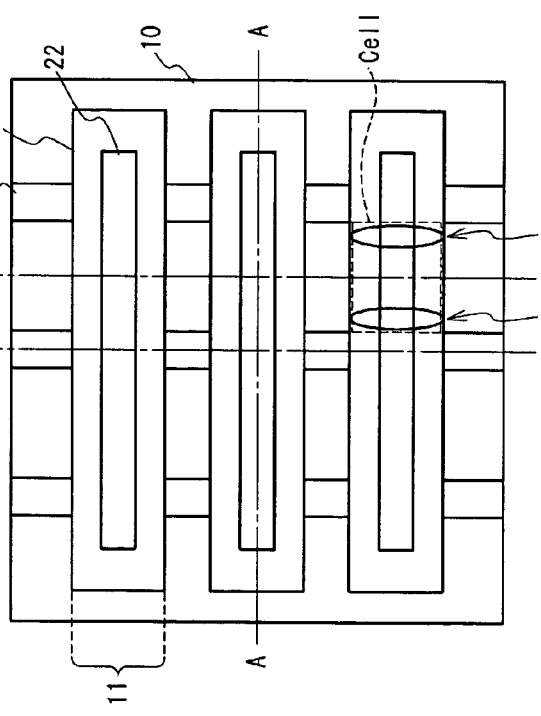
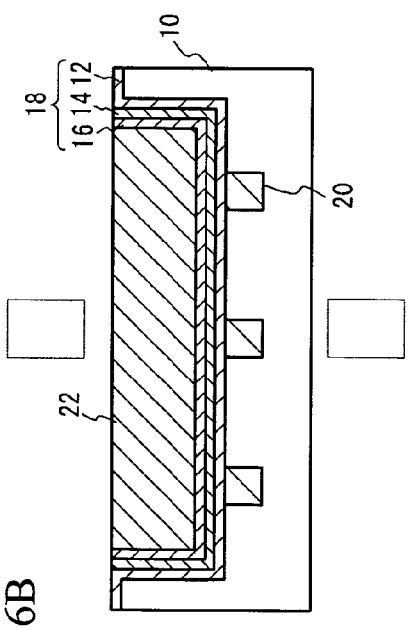

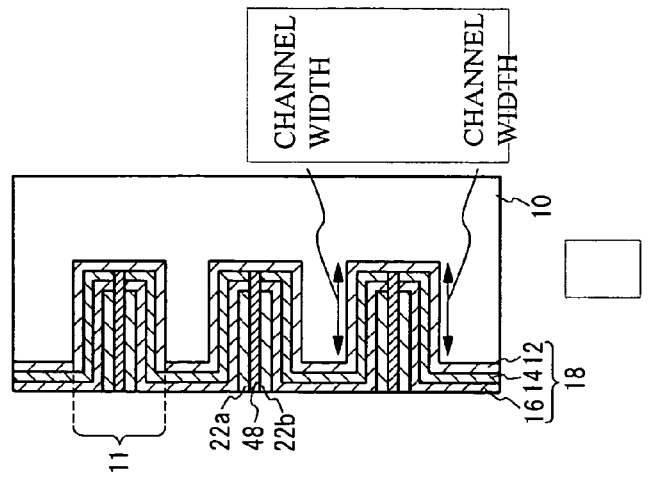
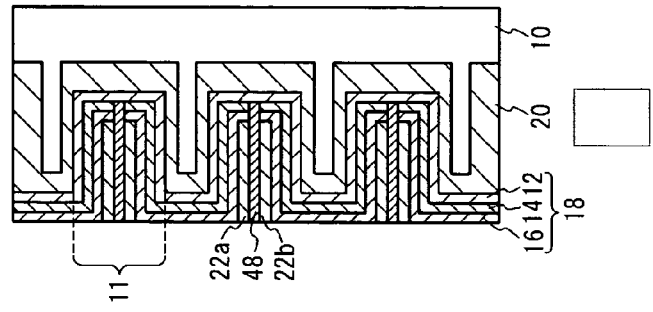
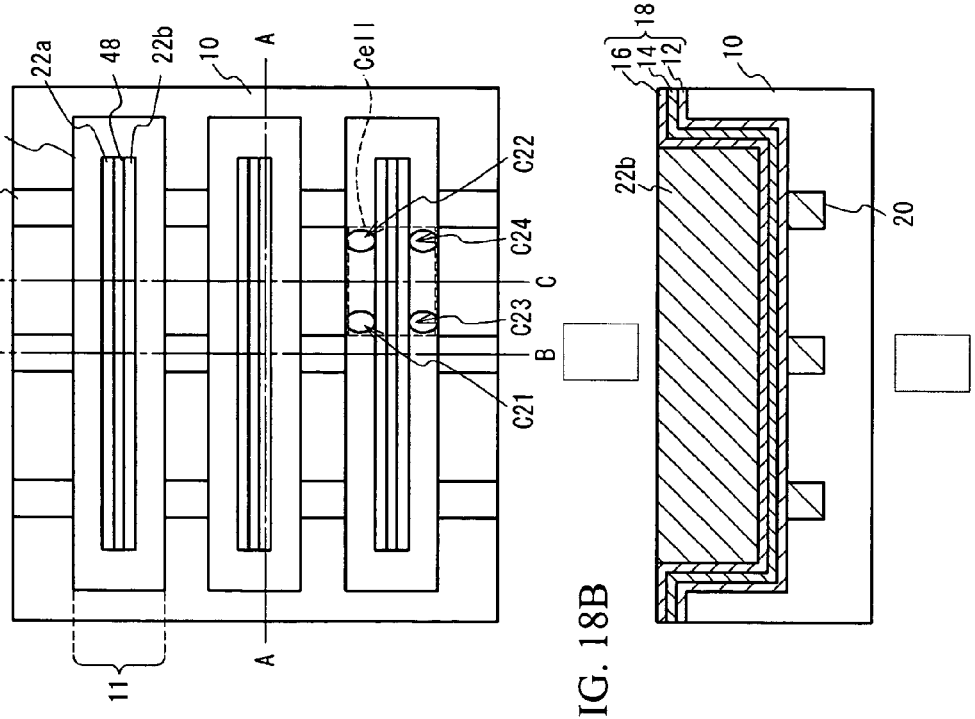

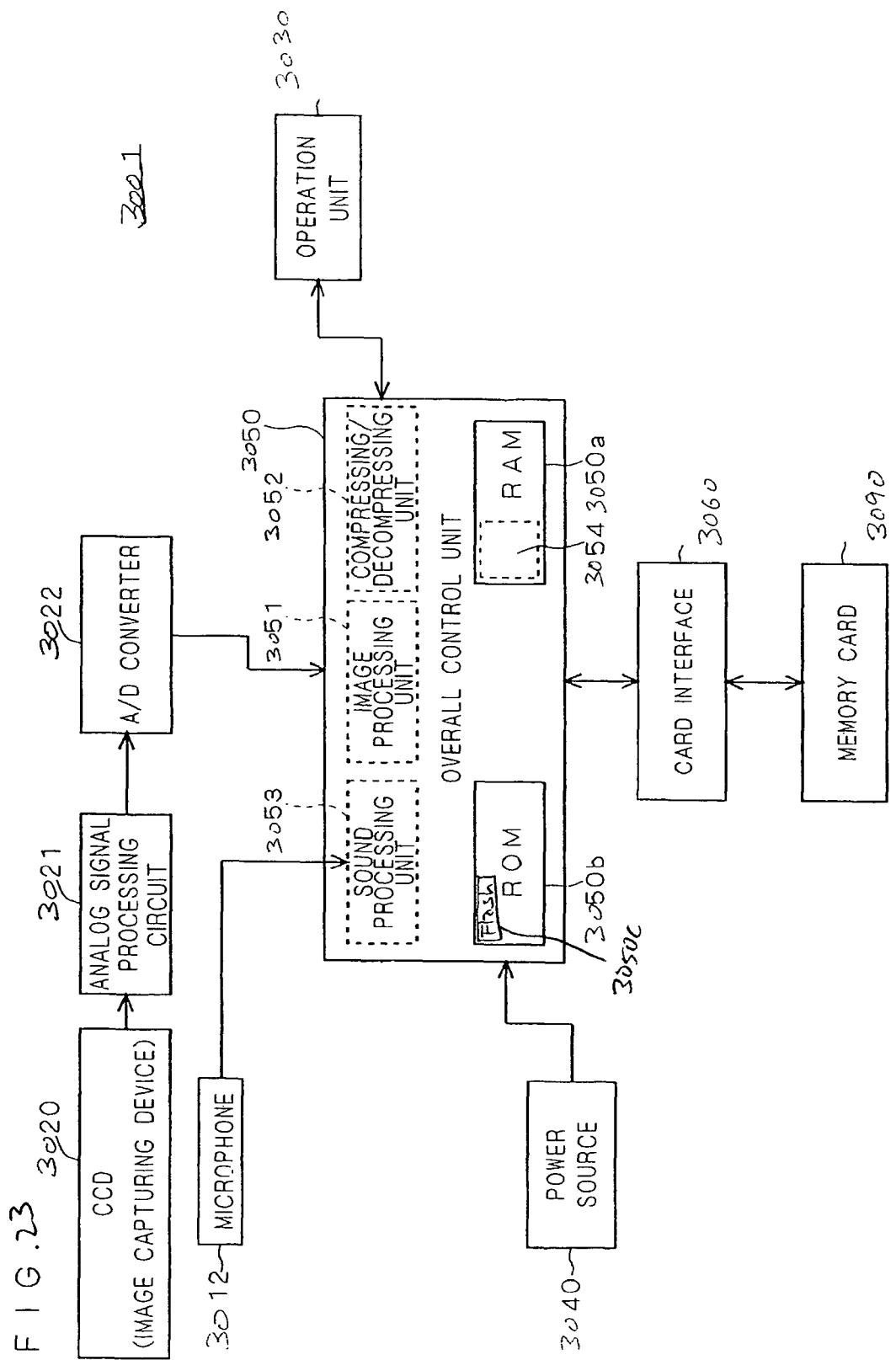

SEMICONDUCTOR DEVICE AND FABRICATION METHOD THEREFOR

CROSS-REFERENCES TO RELATED APPLICATIONS

This application is a continuation of U.S. patent application ser. No. 11/513,693, filed on Aug. 30, 2006, entitled "Semiconductor Device and Fabrication Method Therefor," which is a continuation in part of International Application No. PCT/JP2005/015693, filed on Aug. 30, 2005 and is related to International Application PCT/JP2006/315099, filed on Jul. 31, 2005, which are hereby incorporated herein by reference in their entirety.

TECHNICAL FIELD

This invention relates generally to semiconductors and fabrication methods, and more particularly, to a semiconductor device having an ONO film at side surfaces of trenches formed in a semiconductor substrate and a fabrication method therefor.

BACKGROUND

In recent years, non-volatile memory semiconductor devices, in which data is rewritable, have been widely used. In a flash memory of a typical non-volatile memory, a transistor that composes a memory cell includes a floating gate known as a charge storage layer or an Oxide Nitride Oxide (ONO) film. Then, data is stored by storing the charge in the charge storage layer.

In addition, for higher memory capacity, there have been developed flash memories having various memory cell structures. In U.S. Pat. No. 6,011,725, there is disclosed a NOR flash memory in which two charge storage regions can be formed in the ONO film of one memory cell (conventional example 1). In Japanese Patent Application Publication No. 7-45797, there is disclosed a NAND flash memory in which bit lines made of diffusion layers are respectively formed on the side surfaces of the trenches provided in the semiconductor substrate and floating gates are formed on the side surfaces (conventional example 2). In Japanese Patent Application Publication No. 2003-508914, there is disclosed a flash memory having the bit lines and word lines, the bit lines made of the diffusion layers being respectively provided at corners of projections between the trenches formed in the semiconductor substrate and running in a length direction of the trenches, the word lines running in a width direction of the trenches (conventional example 3).

In the conventional example 1, the memory cells are formed on a plane of the semiconductor substrate, and the memory capacity is insufficient. In the conventional examples 2 and 3, higher memory capacity is achieved by providing the trenches formed in the semiconductor substrate so that the floating gates or the ONO films on the side surfaces of the trenches serve as the charge storage layers. However, the fabrication methods become complicated. For example, the bit lines are separately formed in a width direction of the trenches, so the fabrication methods are complicated.

SUMMARY OF THE INVENTION

This Summary is provided to introduce a selection of concepts in a simplified form that are further described below in the Detailed Description. This summary is not intended to identify key features or essential features of the claimed subject matter, nor is it intended to be used as an aid in determining the scope of the claimed subject matter.

An object of the present invention has been to overcome the above drawbacks of the prior art and has an object of providing a semiconductor device and a fabrication method, in which higher memory capacity is enabled.

According to a first aspect of the present invention, there is provided a semiconductor device including: trenches formed in a semiconductor substrate; first ONO films provided on both side surfaces of the trenches; and first word lines provided on side surfaces of the first ONO films and running in a length direction of the trenches. Higher memory capacity is realized by providing the ONO film at the side surfaces of the trench.

According to a second aspect of the present invention, there is provided a method of fabricating a semiconductor device including: forming trenches in a semiconductor substrate; forming first ONO films on both surfaces of the trenches; and forming first word lines, on a side surface of each of the first ONO films in the trenches to run in a length direction of the trenches. The higher memory density is available by providing the ONO film at the side surfaces of the trench.

BRIEF DESCRIPTION OF THE DRAWINGS

FIG. 3A is a cross-sectional view taken along the line C-C shown in FIG. 1, and FIG. 3B is a cross-sectional view taken along the line D-D shown in FIG. 1;

FIG. 13A is a top view of the flash memory in accordance with a fourth embodiment of the present invention, and FIG. 13B, FIG. 13C, and FIG. 13D are cross-sectional views respectively taken along the lines A-A, B-B, and C-C shown in FIG. 13A;

FIG. 16A is a top view of the flash memory in accordance with a fourth embodiment of the present invention, and FIG. 16B, FIG. 16C, and FIG. 16D are cross-sectional views respectively taken along the lines A-A, B-B, and C-C shown in FIG. 16A;

FIG. 18A is a top view of the flash memory in accordance with a fourth embodiment of the present invention, and FIG. 18B, FIG. 18C, and FIG. 18D are cross-sectional views respectively taken along the lines A-A, B-B, and C-C shown in FIG. 18A.

FIG. 23 illustrates an exemplary digital camera, in accordance with an embodiment of the present claimed subject matter.

DETAILED DESCRIPTION

Reference will now be made in detail to embodiments of the present claimed subject matter, examples of which are illustrated in the accompanying drawings. While the claimed subject matter will be described in conjunction with these embodiments, it will be understood that they are not intended to limit the claimed subject matter to these embodiments. On the contrary, the claimed subject matter is intended to cover alternatives, modifications and equivalents, which may be included within the spirit and scope of the claimed subject matter as defined by the appended claims. Furthermore, in the following detailed description of the present claimed subject matter, numerous specific details are set forth in order to provide a thorough understanding of the present claimed subject matter. However, it will be evident to one of ordinary skill in the art that the present claimed subject matter may be practiced without these specific details. In other instances, well known methods, procedures, components, and circuits have not been described in detail as not to unnecessarily obscure aspects of the claimed subject matter.

A description will now be provided, with reference to the accompanying drawings, of embodiments of the present invention.

First Embodiment

Figure 1:
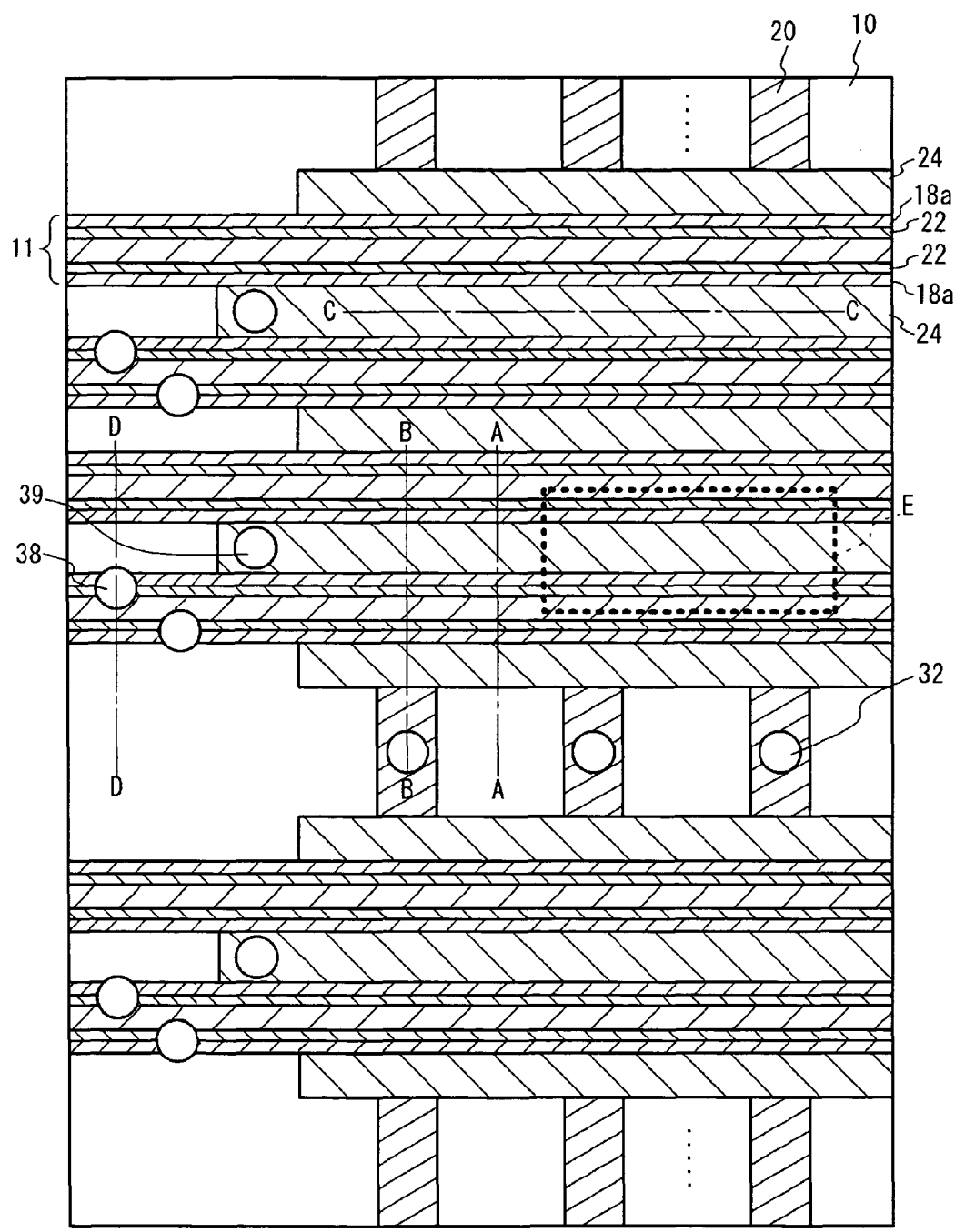
FIG. 1 is a top view of a memory cell region of a flash memory in accordance with a first embodiment of the present invention.
Figure 2A:
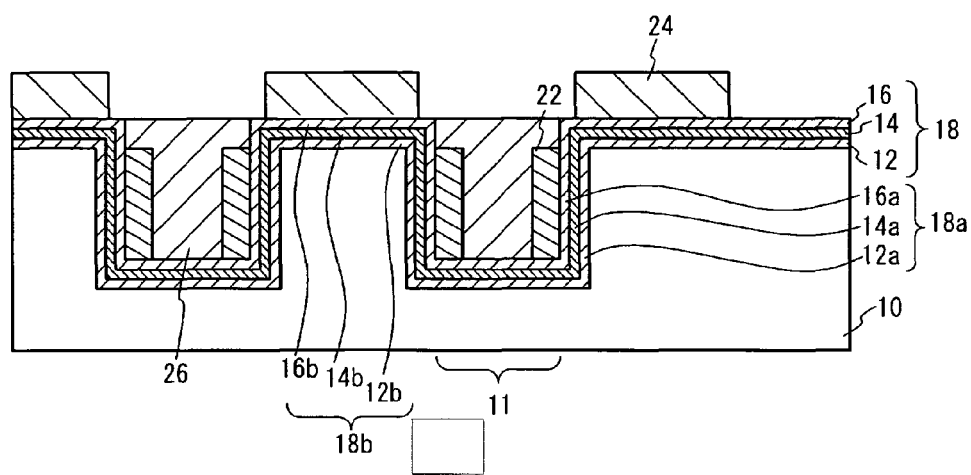
FIG. 2A is a cross-sectional view taken along the line A-A shown in FIG. 1.
Figure 2B:
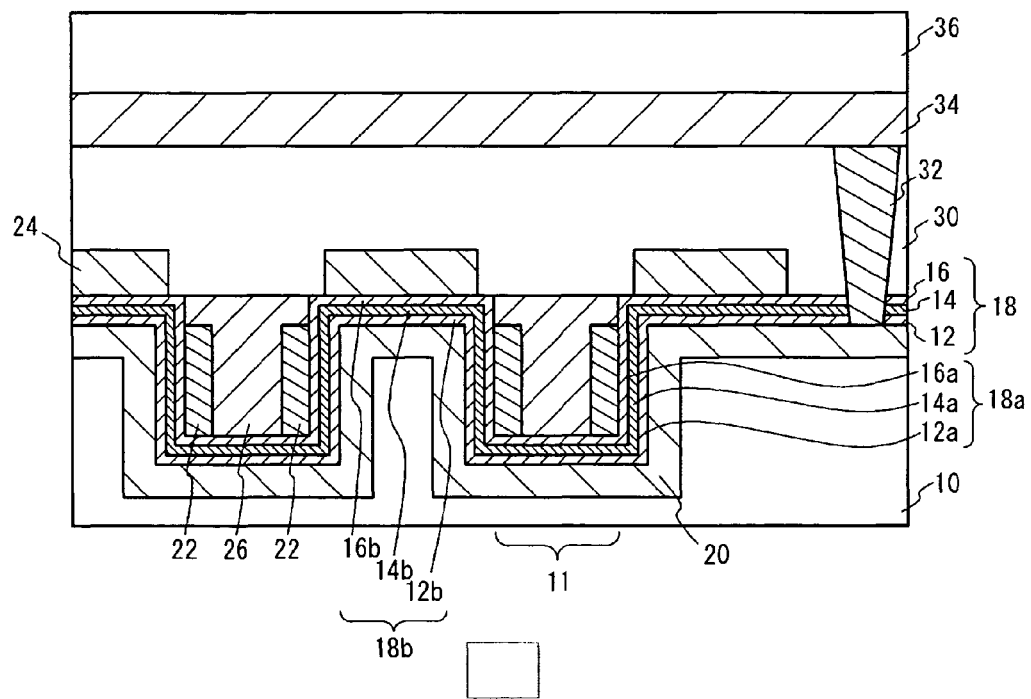
FIG. 2B is a cross-sectional view taken along the line B-B shown in FIG. 1.

FIG. 1 is a top view of a memory cell region of a flash memory in accordance with a first embodiment of the present invention. In FIG. 1, a right-hand side is the memory cell region, and a left-hand side is a region in which word lines and a second wiring layer are connected. First and second interlayer insulation films 30 and 36 and first and second wiring layers 34 and 40 are not shown. Also, on the top and bottom of the drawing, only first and second word lines 22 and 24 and first and second ONO films 18a and 18b are not shown, but only bit lines 20 are shown. FIG. 2A is a cross-sectional view taken along the line A-A shown in FIG. 1, and FIG. 2B is a cross-sectional view taken along the line B-B shown in FIG. 1. FIG. 3A is a cross-sectional view taken along the line C-C shown in FIG. 1. FIG. 3B is a cross-sectional view taken along the line D-D shown in FIG. 1. Here, in FIG. 2A, the first and second wiring layers 34 and 40 and the first and second interlayer insulation films 30 and 36 are not shown.

Referring to FIG. 1, FIG. 2A, and FIG. 2B, trenches 11 are provided in a P-type silicon semiconductor substrate 10 (alternatively, in a P-type region of a semiconductor substrate) to run in a lateral direction of FIG. 1. There are arranged first ONO films 18a on both side surfaces in a width direction of the trenches 11, each of the first ONO films 18a being composed of a tunnel oxide film 12a, a trap layer 14a, and a top oxide film 16a. The first word lines 22 are provided to run in a width direction of the trenches 11 on the side surfaces of the first ONO films 18a. There are also provided second ONO films 18b on the semiconductor substrate 10 between the trenches 11, each of the second ONO films 18b being composed of a tunnel oxide film 12b, a trap layer 14b, and a top oxide film 16b. Second word lines 24, electrically isolated from the first word lines 22, are provided to run in a width direction of the trenches 11 on the second ONO films 18b.

Referring to FIG. 1, the bit lines 20 are provided in the semiconductor substrate 10 to run in a width direction of the trenches 11. Referring to FIG. 2B, the bit lines 20 are formed to be in contact with the side surfaces on the side of the tunnel oxide films 12a of the first ONO films 18a and those on the side of the tunnel oxide films 12b of the first ONO films 18b. Silicon oxide films 26 are embedded in the trenches 11. The first interlayer insulation film 30 is provided on the trenches 11 and on the second word lines 24, and the first wiring layers 34 is provided on the first interlayer insulation film 30 to run in a length direction of the bit lines 20. Referring to FIG. 3A, the first wiring layers 34 are arranged above the bit lines 20. Referring to FIG. 1 and FIG. 2B, the bit line 20 is coupled to the first wiring layer 34 via a contact hole in every multiple trenches 11.

Figure 4:
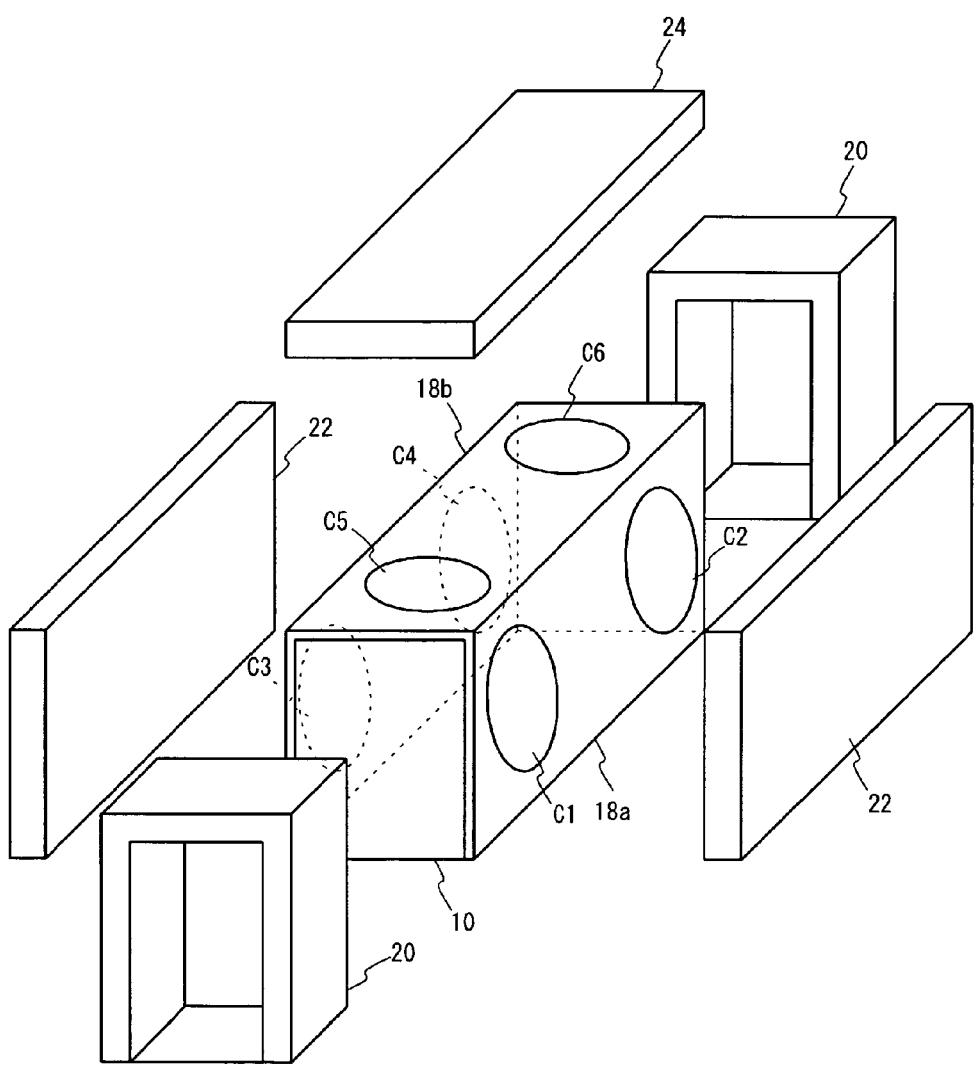
FIG. 4 stereoscopically shows a region E to explain charge storage regions.

FIG. 4 stereoscopically shows a portion of E shown in FIG. 1. To facilitate the understanding, the bit lines 20, the first word lines 22, and the second word lines 24 are shown apart from the first ONO films 18a and the second ONO films 18b. Two charge storage regions C1 and C2 (C3 and C4) are provided on the side surfaces of the first ONO film 18a, namely, on the side surfaces of the first word line 22 between the bit lines 20. In addition, two charge storage regions C5 and C6 are provided at the second ONO film 18b. Accordingly, 6-bit information can be stored in the portion of E.

For example, in storing charge in the charge storage region C1, a positive voltage is supplied to a corresponding first word line 22, and the bit line 20 further from the charge storage region C1 is grounded and a positive voltage is supplied to the bit line 20 closer to the charge storage region C1. By this, hot electrons having become high energy at a channel in the semiconductor substrate 10 are injected into the charge storage region C1, and the charge is stored. In storing charge in the charge storage region C2, the bit line 20 that is grounded and the bit line 20 to which a positive voltage is supplied are changed to each other. In storing charge in the charge storage regions C3 through C6, a positive voltage is supplied to a corresponding first or second word line 22 or 24. In erasing the charge from the charge storage regions C1 through C6, a negative voltage is supplied to a corresponding word line 22 or 24, and one of the bit lines 20 is grounded and a positive voltage is supplied to the other. This injects hot holes into the charge storage region and the charge stored in the charge storage region is erased. In this manner, the charge can be stored and erased in six charge storage regions C1 through C6 shown in FIG. 4.

Figure 5A:
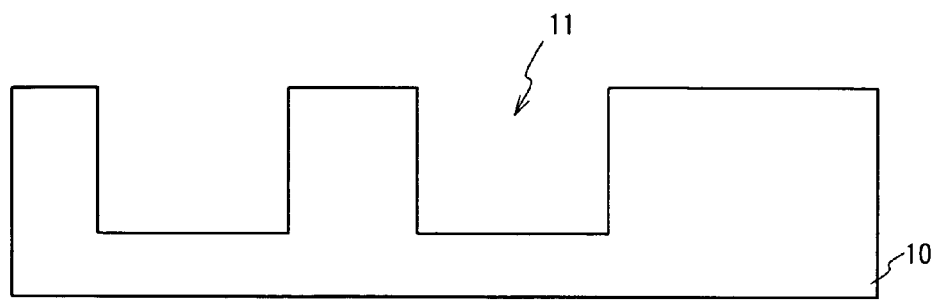
FIG. 5A through FIG. 5C are first cross-sectional views illustrating fabrication processes of the flash memory employed in the first embodiment of the present invention.
Figure 5B:
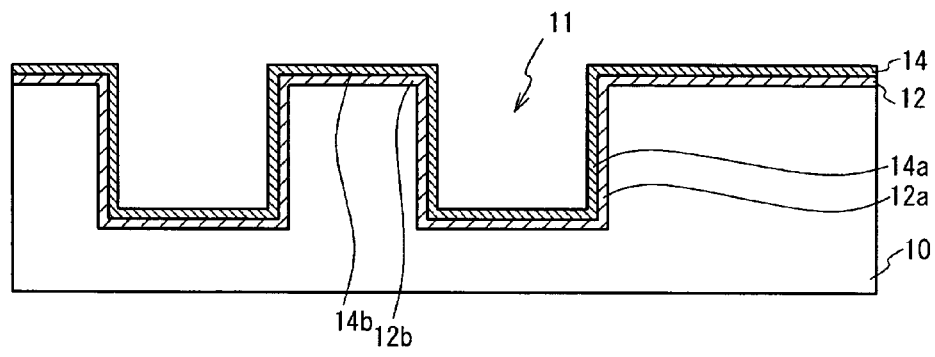
Figure 5C:
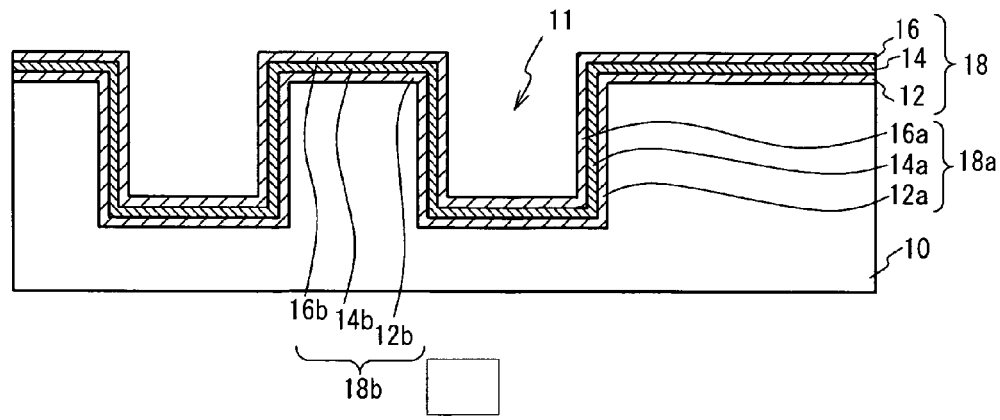

Next, a description will be given of a fabrication method of the flash memory employed in the first embodiment, with reference to FIG. 5A through FIG. 7C. FIG. 5A through FIG. 7C are cross-sectional views taken along the line A-A shown in FIG. 1. Referring to FIG. 5A, the trenches 11 are formed in the P-type silicon semiconductor substrate 10 (alternatively, the P-type region in the semiconductor substrate). Referring to FIG. 5B, a silicon oxide film is provided on the side surfaces of the trenches 11 and on the semiconductor substrate 10 between the trenches 11, as the tunnel oxide film 12 by a thermal oxidation process, for example. In addition, a silicon nitride film is deposited as a trap layer 14 by CVD, for example. An example is that arsenic ions are implanted and then thermally treated, and the bit lines 20 are provided (not shown in FIG. 5B). At this point, the ions are obliquely implanted so that the side surfaces and the bottoms of the trenches 11 are exposed. In this manner, the bit lines 20 can be formed by a simple process. Referring to FIG. 5C, a silicon oxide film is deposited as a top oxide film 16 by CVD, for example. By this, the first ONO film 18a is provided on both side surfaces of the trenches 11, and the second ONO film 18b is provided on the semiconductor substrate 10 between the trenches 11.

Figure 6A:
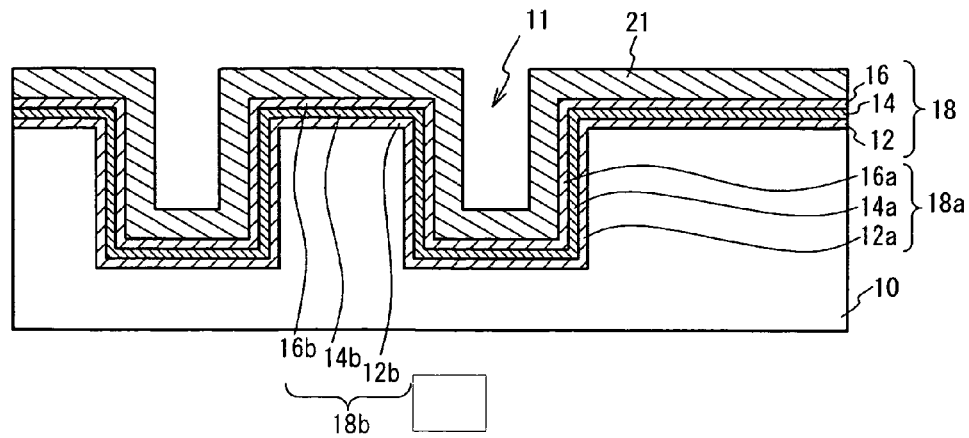
FIG. 6A through FIG. 6C are second cross-sectional views illustrating fabrication processes of the flash memory employed in the first embodiment of the present invention.
Figure 6B:
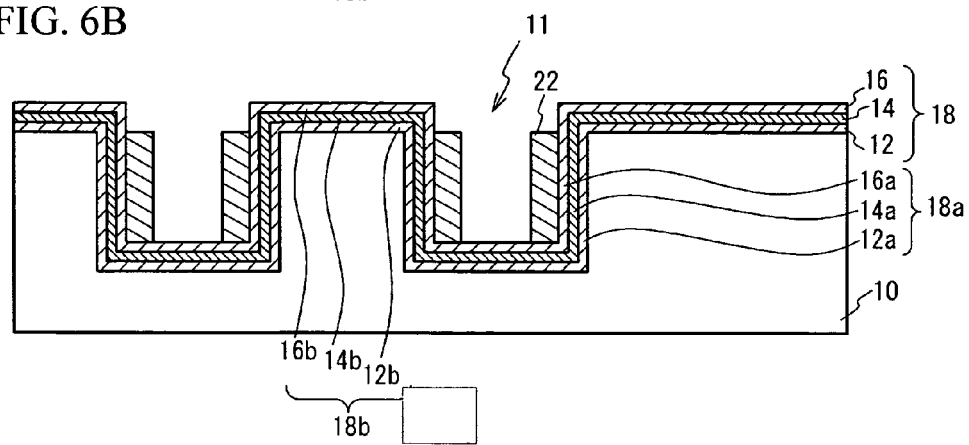
Figure 6C:
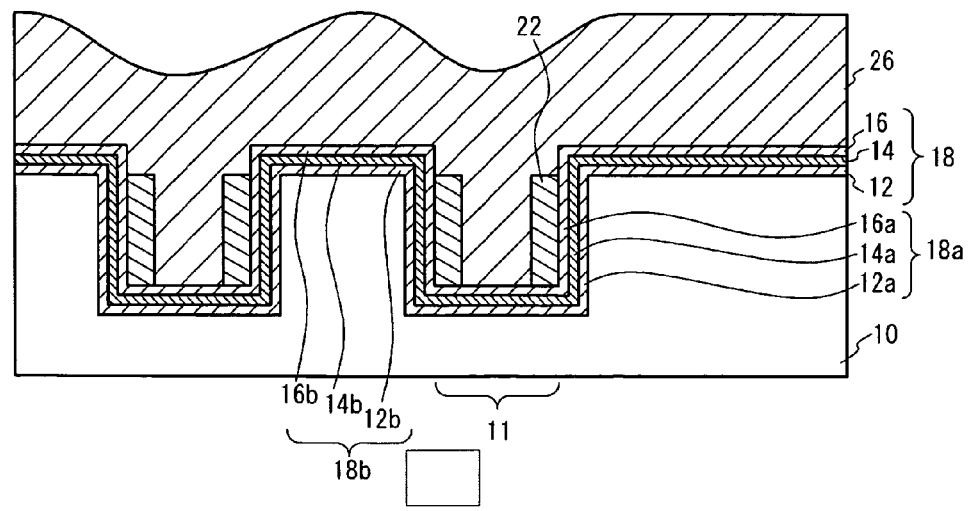

Referring to FIG. 6A, a polysilicon film 21 (a layer to be the first word lines 22) is provided on the side surfaces of the first ONO film 18a in the trenches 11 and on the second ONO films 18b between the trenches 11. Referring to FIG. 6B, the polysilicon film 21 (the layer to be the first word lines 22) of regions between the trenches 11 is removed by etching the whole polysilicon film 21 or polishing by CMP. As described, the first word lines 22 are formed on the side surfaces of the first ONO films 18a in the trenches 11 to run in a length direction of the trenches 11. Referring to FIG. 6C, the silicon oxide film 26 is deposited in the trenches 11 and above the regions between the trenches 11, by a high-density plasma CVD, for example.

Figure 7A:
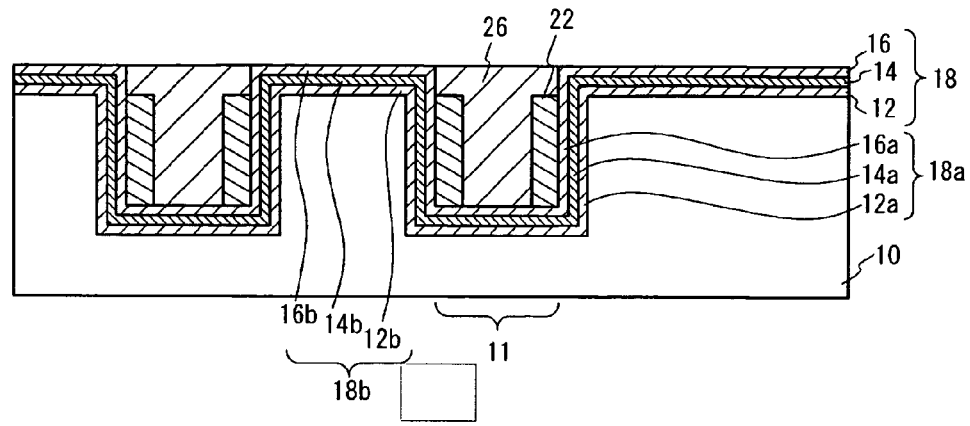
FIG. 7A through FIG. 7C are third cross-sectional views illustrating fabrication processes of the flash memory employed in the first embodiment of the present invention.
Figure 7B:
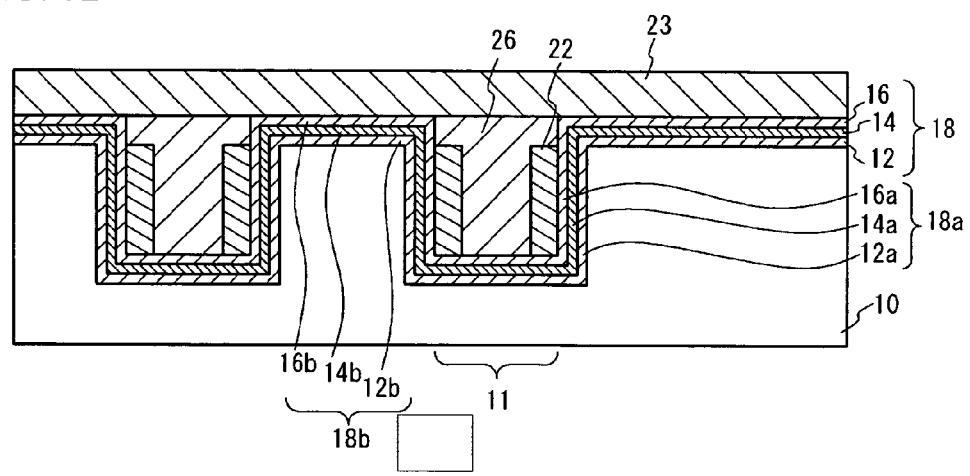
Figure 7C:
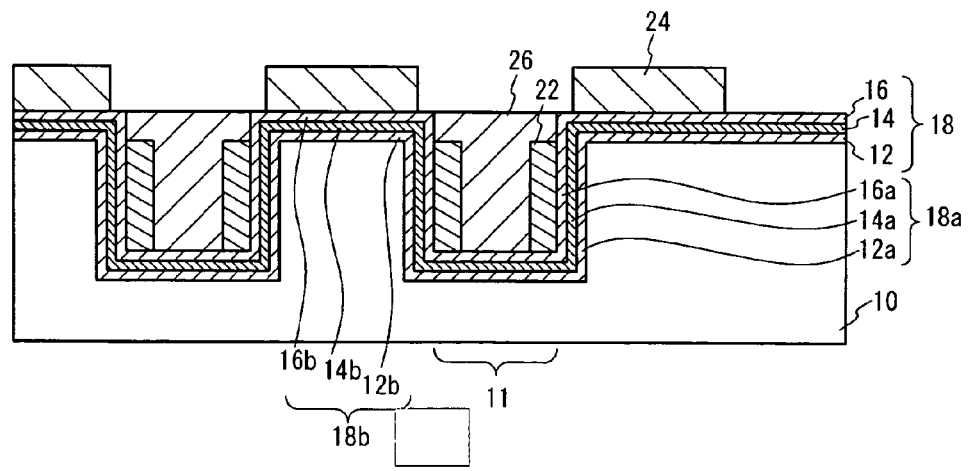

Referring to FIG. 7A, the silicon oxide film 26 is etched back or polished by CMP, so that the silicon oxide film remains in the trenches 11. Referring to FIG. 7B, a polysilicon film 23 is formed on the second ONO film 18b between the trenches 11 and on the silicon oxide films 26. Referring to FIG. 7C, given regions of the polysilicon film 23 are etched, so the second word lines 24 that are electrically isolated are formed on the second ONO films 18b to run in a length direction of the trenches 11.

A first interlayer insulation film 30 made of, for example, a silicon oxide film is provided on the second word lines 24 and on the silicon oxide films 26, and a contact hole 32 is formed in the first interlayer insulation film 30 to be connected to the bit line 20. A metal such as tungsten or the like, for example, is embedded in the contact hole 32. The first wiring layer 34 made of, for example, aluminum is provided on the first interlayer insulation film 30. The second interlayer insulation film 36 made of, for example, a silicon oxide film is deposited on the first wiring layer 34 and above the first interlayer insulation film 30. First or second contact holes 38 and 39 are formed in the first interlayer insulation film 30 and in the second interlayer insulation film 36 to be connected to the first word lines 22 or second word lines 24. A metal such as tungsten or the like, for example, is embedded in the first and second contact holes 38 and 39. A second wiring layer 40 made of, for example, aluminum is provided on the second interlayer insulation film 36. A protection film is provided on the second wiring layer 40 and on the second interlayer insulation film 36. As described above, the flash memory employed in the first embodiment is completed.

As in the first embodiment, the charge storage region can be arranged on the side surfaces of the trenches 11 by providing the second ONO films 18b and the second word lines 24 arranged on the semiconductor substrate 10 between the trenches 11 and also providing the first ONO films 18a and the first word lines 22 on the side surfaces of the trenches 11, thereby realizing higher memory density in a simple fabrication method.

In the flash memory employed in the first embodiment, the bit lines 20 are successively provided in a width direction of the trenches 11 in the semiconductor substrate. The bit lines 20 can be provided with ease successively in a width direction by, for example, ion implantation. There are respectively provided two charge storage regions, out of C1 through C6, in the first ONO film 18a and in the second ONO film 18b between the bit lines 20. This enables further higher memory capacity.

Furthermore, the trap layer 14 is shared by the first ONO film 18a and the second ONO film 18b. Referring to FIG. 5B, the process of forming the first ONO film 18a and the process of forming the second ONO film 18b include the process of forming the trap layer 14 commonly included in the first ONO film 18a and in the second ONO film 18b. This makes it possible to form the ONO films on the side surfaces of the trenches in a simple fabrication method.

Next, a description will be given of a connection method of the first and second word lines 22 and 24 and the second wiring layer 40. Here, in FIG. 1, the first or second word lines 22 and 24 that are not connected to the first or second contact holes 38 or 39 are connected to the first and second contact holes 28 and 39 on an opposite side of the memory cell region. As shown in FIG. 3B, the first and second interlayer insulation films 30 and 36 are provided between the second wiring layer 40 and the first word lines 22, and the first contact holes 38 in which a conductor is embedded to connect the first word lines 22 and the second wiring layer 40. The first contact holes 38, in which a conductor is embedded, are in contact with upper surfaces of the first word lines 22. In this manner, it is possible to connect the first word lines 22 formed at the side surfaces of the trenches 11 and the second wiring layer 40.

Referring to a left-hand side of FIG. 1, the first contact holes 38 connected to a pair of the first word lines 22 arranged on both side surfaces of the trenches 11 are formed in different places of a length direction of the trenches 11. That is to say, in FIG. 1, the first contact holes 38 connected to the first word lines 22 on an upper side of the trenches 11 are provided in different places in a lateral direction of FIG. 1 from the first contact holes 38 connected to the first word lines 22 on a lower side of the trenches 11. By this, even if the distance between the first word lines 22 is short, the second wiring layer 40 can be connected to a pair of the first word lines 22 respectively, via the first contact holes 38. Accordingly, higher capacity and higher density are achieved.

The first and second interlayer insulation films 30 and 36 has the second contact holes 39 connected to the second word lines 24, the second contact holes 39 being arranged in different places from the first contact holes 38 in a length direction of the trenches 11. The second contact holes 39 are provided closer to the memory cell side than the first contact holes 38, and the second word lines 24 are not arranged between the trenches 11 adjacently provided to the first contact holes 38. This allows the second wiring layer 40 to be connected to the first word lines 22 and to the second word lines 24 respectively, even if there is a short distance between the first word lines 22 and the second word lines 24. Accordingly, higher capacity and higher density are realized.

Here, in the first embodiment, the width of the trench 11 is 260 nm, the distance between the first word lines 22 in the trench 11 is 100 nm, the height and the width of the first word lines 22 are respectively 150 nm and 50 nm, the height and the width of the second word lines 24 are respectively 100 nm and 150 nm, and the first and second ONO films have thickness of 30 nm. However, the present invention is not limited to the above-described sizes. Also, as shown in FIG. 2B, the bit lines 20 are formed in the semiconductor substrate 10 near the side surfaces of the trenches 11. However, the bit lines 20 may be formed in regions of projected shapes in the whole semiconductor substrate 10. Also in the afore-mentioned case, the bit lines 20 can function as those employed in the first embodiment.

Second Embodiment

Figure 8:
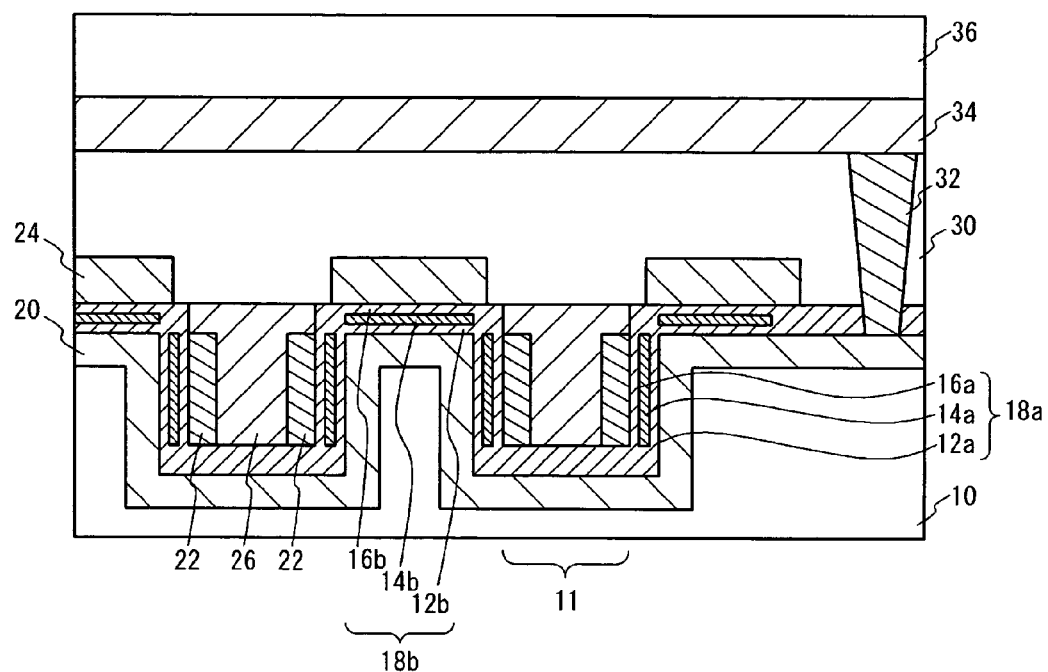
FIG. 8 is a cross-sectional view of the flash memory in accordance with a second embodiment of the present invention.

FIG. 8 is a cross-sectional view of the flash memory taken along the line B-B shown in FIG. 1 in accordance with a second embodiment of the present invention. The trap layer 14a of a first ONO film 18a is physically isolated from the trap layer 14b of a second ONO film 18b. Other configurations are same as those of FIG. 2B in accordance with the first embodiment, and the same components and configurations as those shown in FIG. 2B have the same reference numerals and a detailed explanation will be omitted.

Figure 9A:
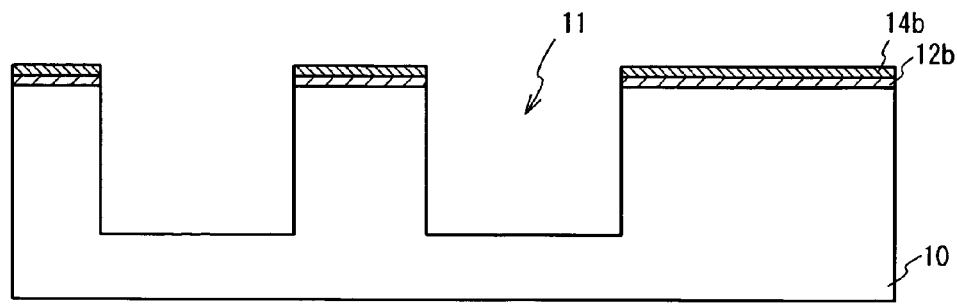
FIG. 9A through FIG. 9C are first cross-sectional views illustrating fabrication processes of the flash memory employed in a second embodiment of the present invention.
Figure 9B:
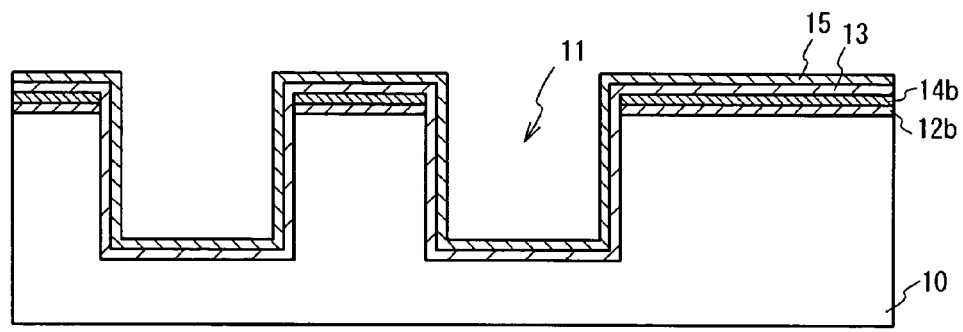
Figure 9C:
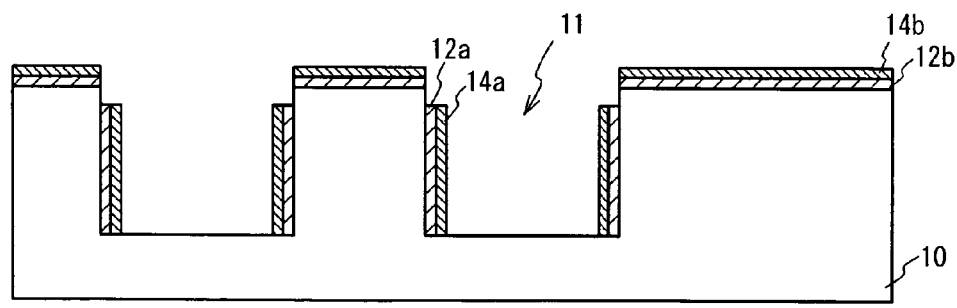

Next, a fabrication method of the flash memory employed in the second embodiment will be described, with reference to FIG. 9A through FIG. 10B. FIG. 9A through FIG. 10B are cross-sectional views taken along the line A-A shown in FIG. 1. Referring to FIG. 9A, a silicon oxide film is formed on the semiconductor substrate 10 as a tunnel oxide film 12b by, for example, a thermal oxidation process. A silicon nitride film is deposited on the tunnel oxide film 12b as the trap layer 14b by, for example, CVD. Given regions of the trap layer 14b, the tunnel oxide film 12b, and the semiconductor substrate 10 are etched to form the trenches 11. Referring to FIG. 9B, a silicon oxide film 13 and a silicon nitride film 15 are deposited on the side surfaces of the trenches and on the trap layer 14b between the trenches 11, by CVD. Referring to FIG. 9C, the silicon nitride film 15 and the silicon oxide film 13 are etched back, and the trap layer 14a and the tunnel oxide film 12a are provided on the side surfaces of the trenches 11. For example, the bit lines 20 (not shown in FIG. 9C) are formed by implantation of arsenic ions and subsequent thermal treatment.

Figure 10A:
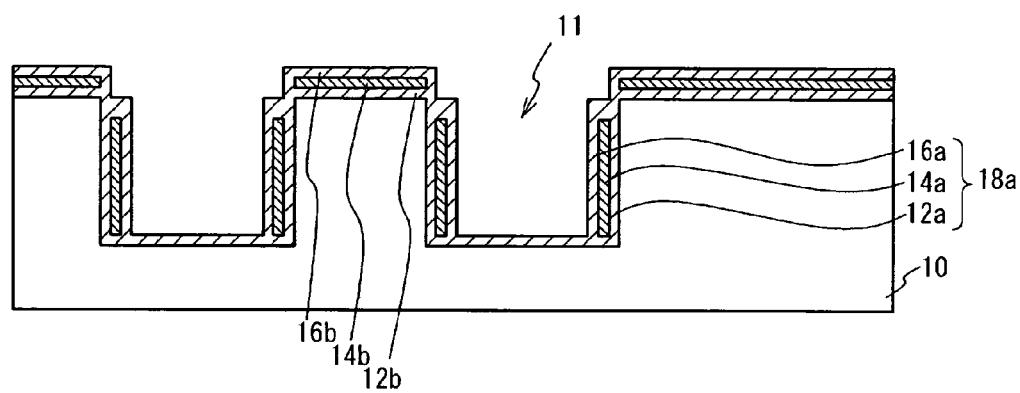
FIG. 10A and FIG. 10B are second cross-sectional views illustrating fabrication processes of the flash memory employed in the second embodiment of the present invention.
Figure 10B:
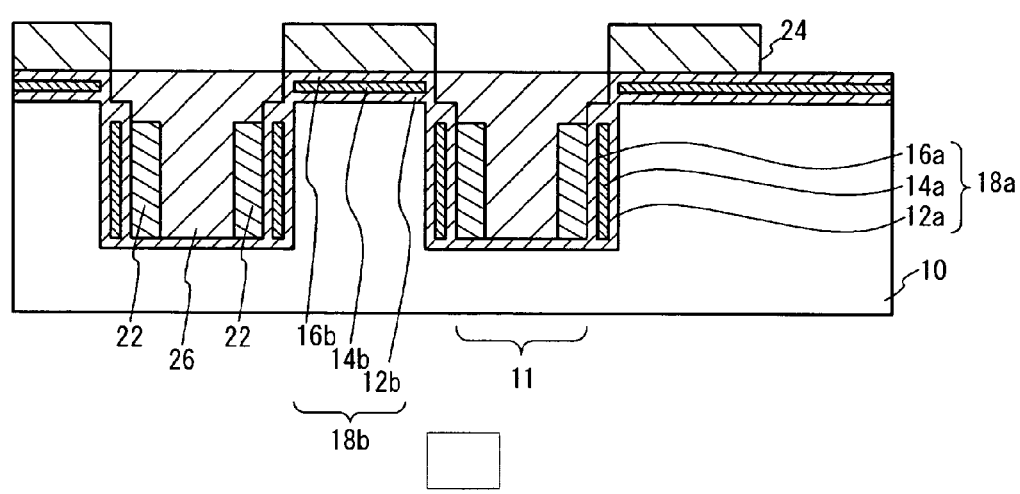

Referring to FIG. 10A, a silicon oxide film is deposited by CVD as top oxide films 16a and 16b so as to cover the trap layer 14a and the trap layer 14b. In this manner, the first ONO films 18a are provided on both side surfaces of the trenches 11 and the second ONO films 18b are provided on the semiconductor substrate 10 between the trenches 11. Referring to FIG. 10B, in the same fabrication method as FIG. 6A through FIG. 7C shown in accordance with the first embodiment, the first word lines 22 are provided on the side surfaces of the first ONO films 18a to run in a length direction of the trenches 11, and the second word lines 24 electrically isolated from the first word lines 22 are provided on the second ONO film 18b to run in a length direction of the trenches 11. Subsequently, in a similar manner as the first embodiment, the first and second interlayer insulation films 30 and 36, the first and second wiring layers 34 and 40, and the contact holes 32, 38, and 39 are formed. As described heretofore, the flash memory employed in the second embodiment is completed.

As in the first embodiment, if the trap layer 14a of the first ONO film 18a and the trap layer 14b of the second ONO film 18b are a shared trap layer, the charge may be stored in the ONO films at both sides of the word lines at the time of data writing. If so, the charge stored at the both sides of the word lines cannot be erased, or the charge is stored in the adjacent trap later. This may cause a malfunction. In the second embodiment, the first ONO films 18a and the second ONO films 18b respectively have different trap layers 14a and 14b. This can prevent the charge from being stored in the trap layers 14a and 14b of the first and second ONO films 18a and 18b at both sides of the first and second word lines 22 and 24.

In the second embodiment, the process of forming the first ONO film 18a includes: a process of forming the trap layer 14a (first trap layer) as shown in FIG. 9A; and a process of forming the trap layer 14b (second trap layer) as shown in FIG. 9C, which is different from the process of forming the trap layer 14a. This makes it possible to form different trap layers 14a and 14b.

In addition, the process of forming the first ONO films 18a and the process of forming the second ONO films 18b include a process of simultaneously forming the a common top oxide film made of the top oxide films 16a in the first ONO films 18a and the top oxide films 16b in the second ONO films 18b. This can reduce the fabrication process.

Third Embodiment

Figure 11A:
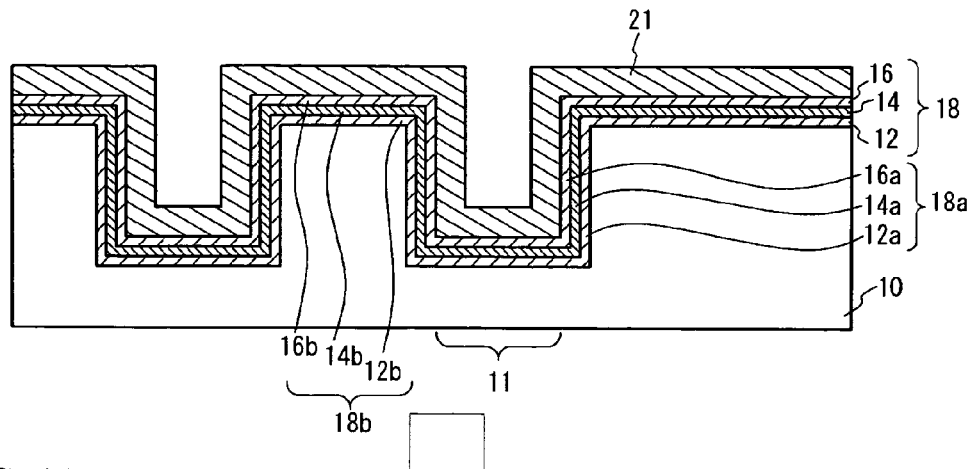
FIG. 11A through FIG. 11C are first cross-sectional views illustrating fabrication processes of the flash memory employed in a third embodiment of the present invention.
Figure 11B:
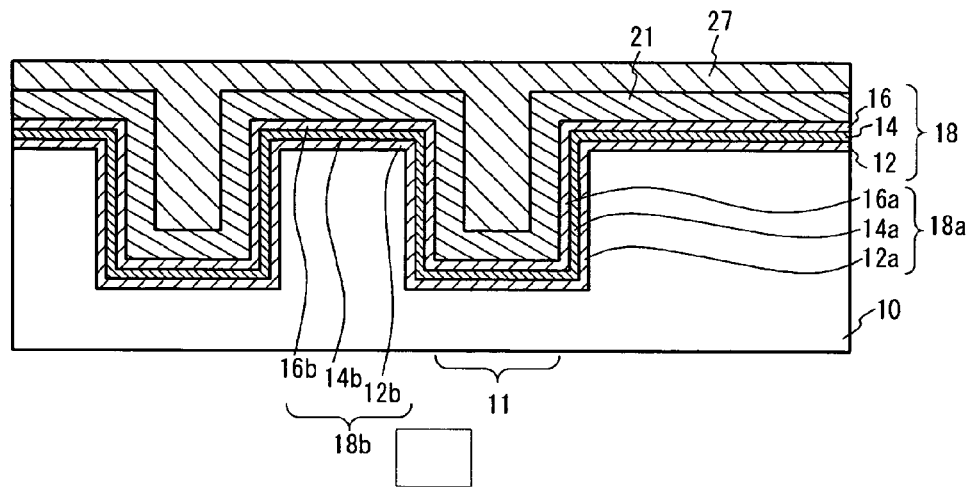
Figure 11C:
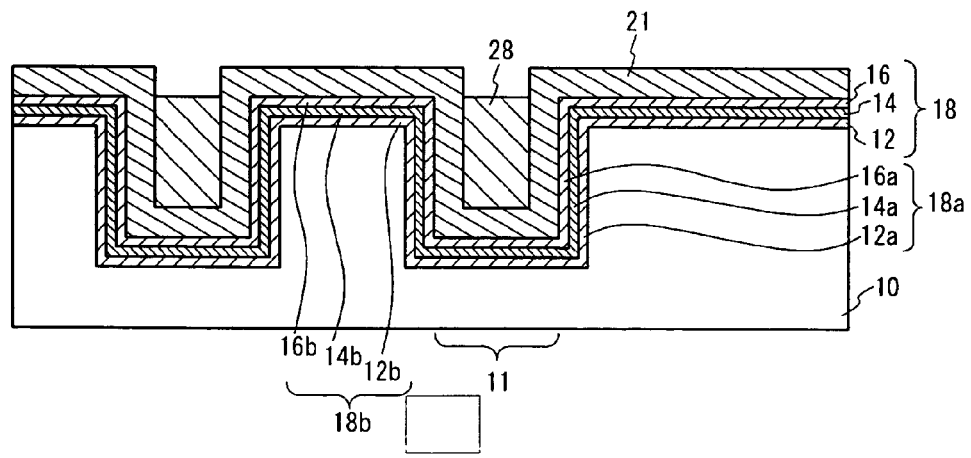

A third embodiment is an example of the fabrication method in which the protection layer is formed when the first word lines 22 are formed. A description will be given of the fabrication method of the flash memory employed in the third embodiment, with reference to FIG. 11A through FIG. 12C. FIG. 11A through FIG. 12C are cross-sectional views taken along the line A-A shown in FIG. 1. Referring to FIG. 11A, in a similar fabrication process as shown in FIG. 5A through FIG. 6A shown in accordance with the first embodiment, the polysilicon film 21 (the layer to be the first word lines 22) is formed on the side surfaces of the first ONO films 18a and on a top surface of the second ONO film 18b. Referring to FIG. 11B, a protection film 27 is applied in the trenches 11 and onto the polysilicon film 21 between the trenches 11. A resin such ad Hydrogen-Silsesquioxane (HSQ) or the like is employed for the protection film 27. Referring to FIG. 11C, the protection layer 27 between the trenches 11 is etched. By this, a protection layer 28 embedded in the polysilicon film 21 formed on the side surfaces of the trenches 11. At this point, in one embodiment, a top surface of the protection layer 28 is almost as high as a lower surface of the polysilicon film 21 provided on the second ONO film 18b between the trenches 11.

Figure 12A:
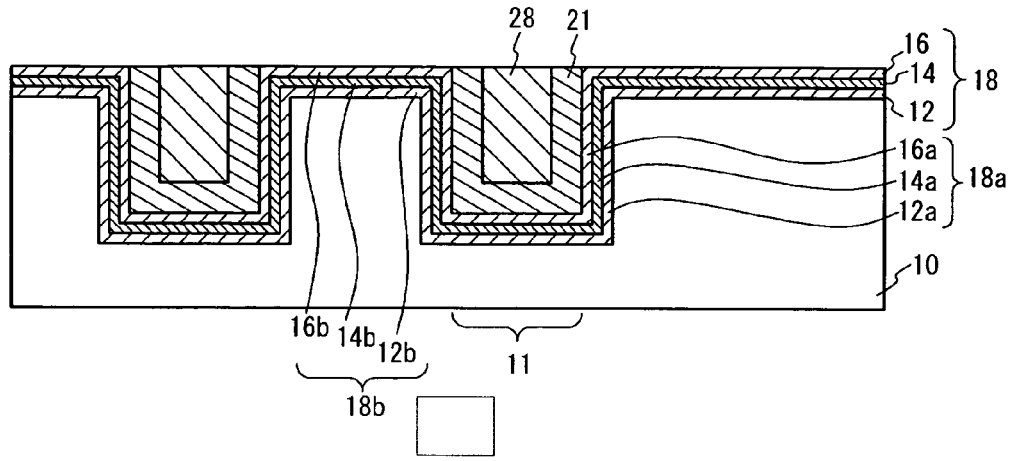
FIG. 12A through FIG. 12C are first cross-sectional views illustrating fabrication processes of the flash memory employed in the third embodiment of the present invention.
Figure 12B:
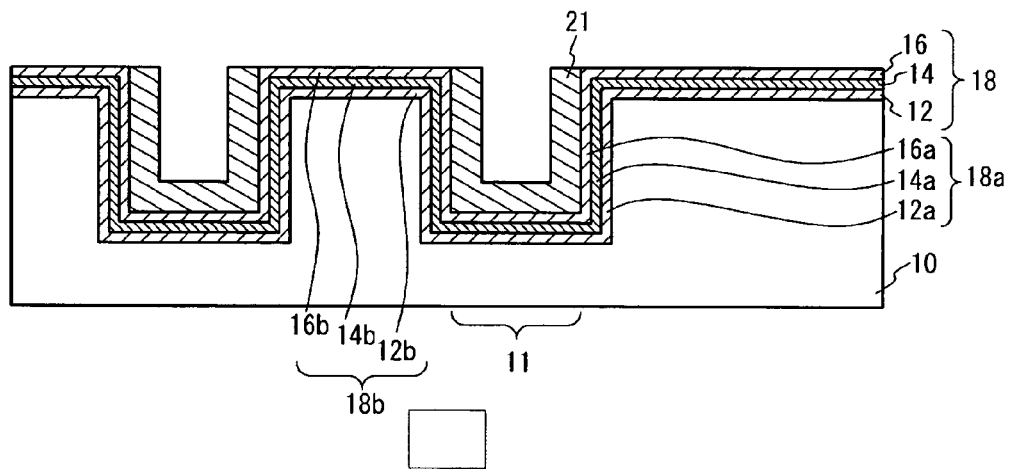
Figure 12C:
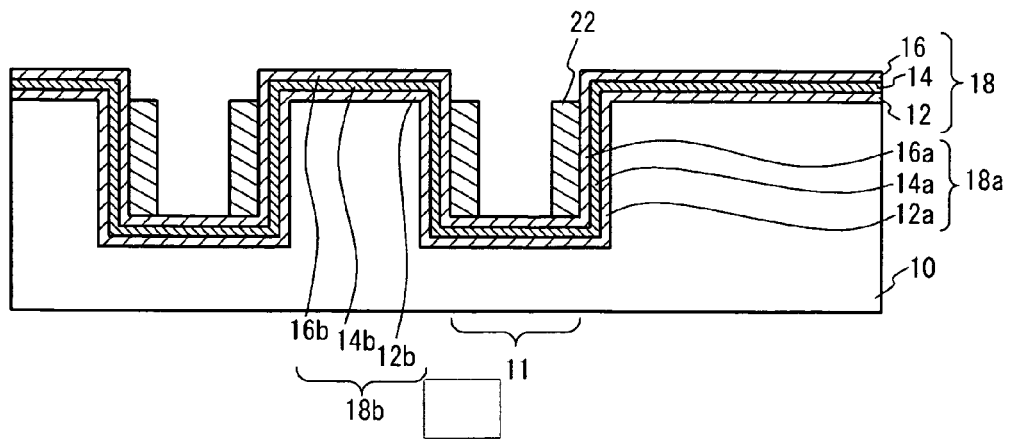

Referring to FIG. 12A, the polysilicon film 21 provided on the second ONO film 18b between the trenches 11 is polished by CMP. At this time, by employing a resin such as HSQ or the like as the protection layer 28, the protection layer 28 serves as a polishing stopper, making it possible to stop polishing just before the second ONO film 18b is polished. That is to say, the polysilicon film 21 having substantially the same height as the top surface of the protection layer 28 remains on both side surfaces of the first ONO films 18a. Referring to FIG. 12B, the protection layer 28 in the trenches 11 is removed by ashing. Referring to FIG. 12C, the polysilicon film 21 above bottom surfaces of the trenches 11 is removed by etching the whole surface of the polysilicon film 21. In this manner, the first word lines 22 are formed on the side surfaces of the first ONO films 18a. Then, by performing the process subsequent to FIG. 6C, the flash memory employed in the third embodiment is completed.

In the fabrication method of the flash memory employed in the first embodiment, when the polysilicon film 21 is etched in FIG. 6B, the polysilicon film 21 is likely to remain on the second ONO film 18b and above the bottom surfaces of the trenches 11, thereby leading to a possibility that the second word lines 24 to be formed hereafter and the first word lines 22 cannot be electrically isolated. Accordingly, if an over etching is performed to completely remove the polysilicon film 21, the height of the first word line will be reduced.

In accordance with the fabrication method employed in the third embodiment, the process of forming the first word lines 22 includes the process of forming the protection layer 28 embedded in the polysilicon films 21 inside of the trenches 11, as shown in FIG. 11A through FIG. 11C. Also, as shown in FIG. 12B, the process of removing the polysilicon film 21 between the trenches 11 allows the polysilicon film 21 to remain on the side surfaces of the first ONO film 18a to be substantially the same height as the top surface of the protection layer 28. Then, the polysilicon film 21 above bottom surfaces of the trenches 11 is removed. This can prevent the polysilicon film 21 from remaining on the second ONO film 18b between the trenches 11 and on the bottom surfaces of the trenches 11. Accordingly, there is no necessity of over etching, and the height of the first word lines 22 can be maintained.

The process of removing the polysilicon film 21 includes the process of polishing the polysilicon film 21 by means of CMP, thereby stopping polishing the polysilicon film 21 on the second ONO film 18b with the use of the protection layer 28 serving as a polishing stopper. In addition, the protection layer 28 can be removed later. In addition to the resin such as HSQ or the like, it is only necessary that the protection layer 28 serve as a polishing stopper layer of the layer to be the word lines made of, for example, the polysilicon film 21. The fabrication method employed in the third embodiment is applicable to that employed in the second embodiment.

Fourth Embodiment

A fourth embodiment of the present invention is an example in which the first ONO film formed in an identical trench is connected on the bottom surface of the trench and the first word line formed in an identical trench composes one word line. FIG. 13A is a top view of the flash memory employed in the fourth embodiment (the ONO film on the semiconductor substrate between the trenches is not shown). FIG. 13B, FIG. 13C, and FIG. 13D are cross-sectional views respectively taken along the lines A-A, B-B, and C-C shown in FIG. 13A. Here, the interlayer insulation film, the contact holes, and the wiring layer are not shown. Also, in FIG. 13A, three bit lines 20 are shown, although there are multiple ones in fact.

Referring to FIG. 13A, the trenches 11 are provided to run in a lateral direction of FIG. 13A on a top surface of the P-type silicon semiconductor substrate 10 (alternatively, in the P-type region of the semiconductor substrate). Referring to FIG. 13A, FIG. 13C, and FIG. 13D, there are provided a first ONO films 18, each of which is composed of: the tunnel oxide film 12; the trap layer 14; and the top oxide film 16, on both side surfaces of a width direction of the trenches 11. The first ONO film 18 formed on the both side surfaces in an identical trench 11 is connected on the bottom surfaces of the trenches 11 to form one ONO film 18. The first ONO films 18 provided on the adjacent side surfaces of adjacent trenches 11 are connected on the semiconductor substrate 10 between the trenches 11 to form a single ONO film 18. In this manner, the first ONO film 18, which is formed on the side surfaces of the trenches 11, on the bottom surfaces of the trenches 11, and on the semiconductor substrate 10 between the trenches 11, is continuously and integrally formed. The first word lines 22 are provided on inner surfaces of the first ONO film 18 in the trenches 11 to run in a width direction of the trenches 11. The first word line 22 provided on the side surfaces of the first ONO film 18 in an identical trench 11 forms a single word line 22. Referring to FIG. 13A, the bit lines 20 are arranged in the semiconductor substrate 10 to run in a width direction of the trenches 11. Referring to FIG. 13C, the bit lines 20 are formed to be in contact with the side surfaces of the tunnel oxide film 12 of the first ONO film 18.

Referring to FIG. 14A through FIG. 15D, a description will be given of the fabrication method of the flash memory employed in the fourth embodiment of the present invention, with reference to FIG. 14A through FIG. 15D. FIG. 14A through FIG. 14C and FIG. 15A and FIG. 15B are cross-sectional views taken along the line A-A of FIG. 13A.

Figure 14A:
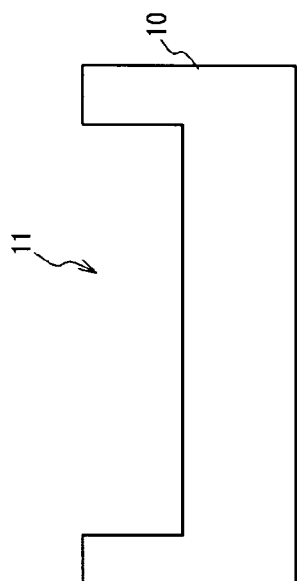
FIG. 14A through FIG. 14(f) are first cross-sectional views illustrating fabrication processes of the flash memory employed in a fourth embodiment of the present invention.
Figure 14B:
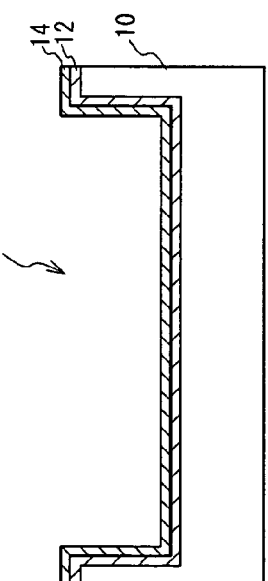
Figure 14C:
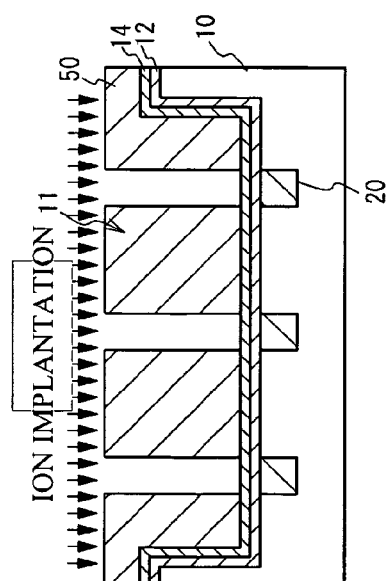
Figure 14D:
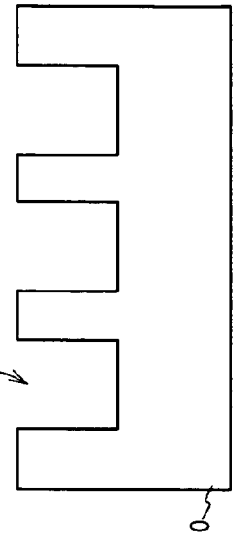
Figure 14E:
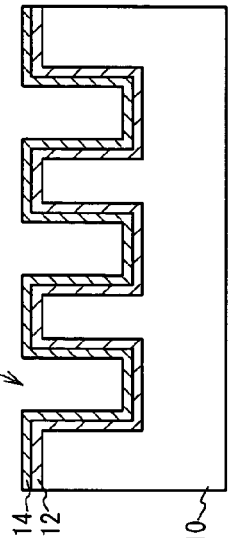
Figure 14F:
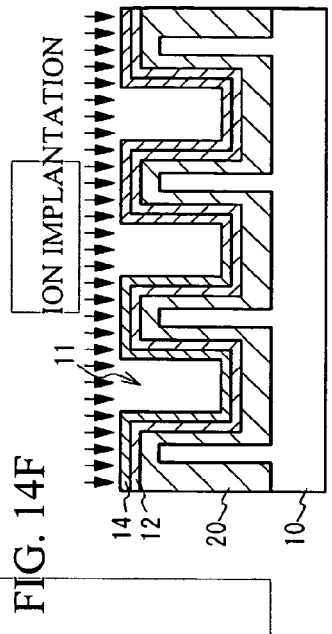

Referring to FIG. 14A through FIG. 14D, the trenches 11 are formed in the semiconductor substrate 10 by using lithography and etching technology. Referring to FIG. 14B and FIG. 14(e), for example, a silicon oxide film is provided on both side surfaces of the trenches 11, on the bottom surfaces of the trenches 11, and on the semiconductor substrate between the trenches 11, as the tunnel oxide film 12 by using, for example, a thermal oxidation process. A silicon nitride film is deposited on the tunnel oxide film 12 as the trap layer 14 by CVD. Referring to FIG. 14C and FIG. 14(f), a photoresist 50 is provided on the trap layer 14, and openings are arranged in the photoresist 50 by using the lithography. Arsenic ions, for example, are implanted in the semiconductor substrate 10 below the openings. Subsequently, by performing the thermal treatment, the N-type bit lines 20 are formed in the semiconductor substrate 10.

Figure 15A:
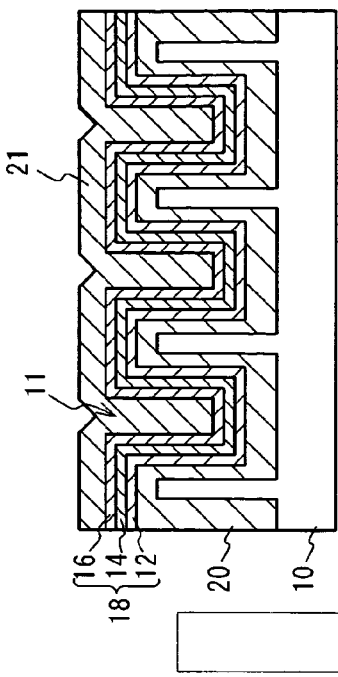
FIG. 15A through FIG. 15D are second cross-sectional views illustrating fabrication processes of the flash memory employed in the fourth embodiment of the present invention.
Figure 15B:
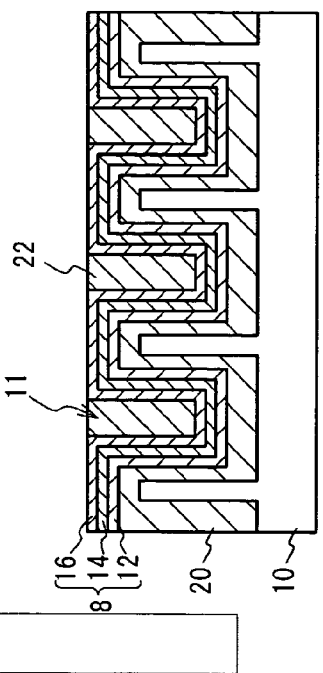
Figure 15C:
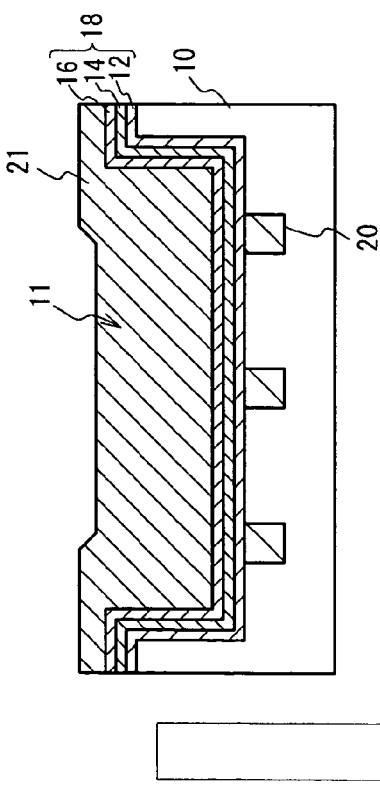
Figure 15D:
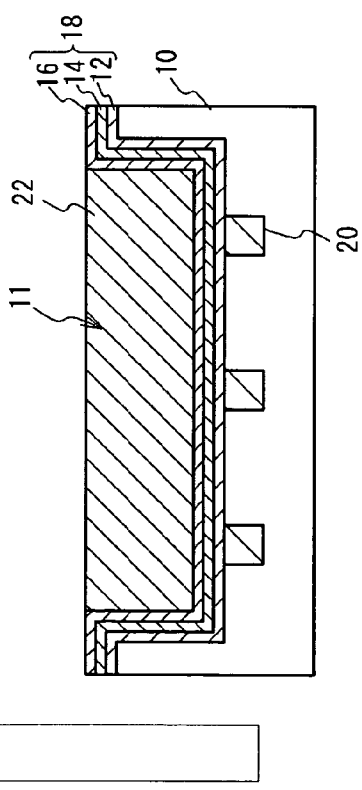

Referring to FIG. 15A and FIG. 15C, the photoresist 50 is removed, and the silicon oxide film is formed on the trap layer 14 as the top oxide film 16. By this, the ONO film 18 composed of the tunnel oxide film 12, the trap layer 14, and the top oxide film 16 is provided on both side surfaces, on the bottom surfaces of the trenches, and on the semiconductor substrate 10 between the trenches 11. The polysilicon film 21 to be the first word lines 22 is deposited by, for example, CVD. Referring to FIG. 15B and FIG. 15D, the polysilicon film 21 is polished by CMP, and the first word lines 22 embedded in the trenches 11 are formed. In this manner, the first word lines 22 are formed on both side surfaces of the two first ONO films 18 in the trench 11 to run in a length direction of the trenches 11. The interlayer insulation film is formed, the contact holes in which conductors are embedded connected to the bit lines 20 and the first word lines 22 are formed, the wiring layer connected to the contact holes are formed, and the flash memory employed in the fourth embodiment is completed.

Referring to FIG. 13A, there are provided channels below the first word line 22 and between the adjacent bit lines 20 in a memory cell Cell. As represented by the arrow in FIG. 13D, a channel width is both sides of the trench 11 and the bottom of the trench 11 in the semiconductor substrate 10. Two charge storage regions C11 and C12 are formed in the first ONO film 18 in contact with the channel arranged on the sides of the bit lines 20 in the memory cell Cell shown in FIG. 13A.

In the flash memory employed in the conventional example 1, as the memory cell is miniaturized and the word line width is narrowed, the width of the channel formed between the bit lines and below the word line is narrowed. If so, the charge stored in the charge storage region is reduced in the ONO film. Accordingly, there are greater effects of the charge reduced from the charge storage region due to charge loss and a fringing current flowing in the semiconductor substrate below the both sides of the word lines. In accordance with the fourth embodiment, charge is stored in the first ONO film 18 arranged on the both sides and on the bottoms of the trenches 11 formed in the semiconductor substrate 10, so the channel width can be widened. This can increase the charge stored in the charge storage region. Accordingly, the effect of the charge loss or the fringing current becomes smaller. As described heretofore, the memory cell can be miniaturized.

Fifth Embodiment

A fifth embodiment is an example in which the trap layers 14 in the first ONO films 18 arranged on adjacent side surfaces of the adjacent trenches 11 are isolated from each other. FIG. 16A is a top view of the flash memory employed in the fifth embodiment. FIG. 16B, FIG. 16C, and FIG. 16D are cross-sectional views respectively taken along the lines A-A, B-B, and C-C shown in FIG. 16A. Referring to FIG. 16B through FIG. 16D, neither the trap layer 14 nor the top oxide film 16 of the first ONO film 18 are provided on the semiconductor substrate 10 between the trenches 11. Other configurations are same as those employed in the fourth embodiment, and the same components and configurations as those employed in the fourth embodiment have the same reference numerals and a detailed explanation will be omitted.

Figure 17A:
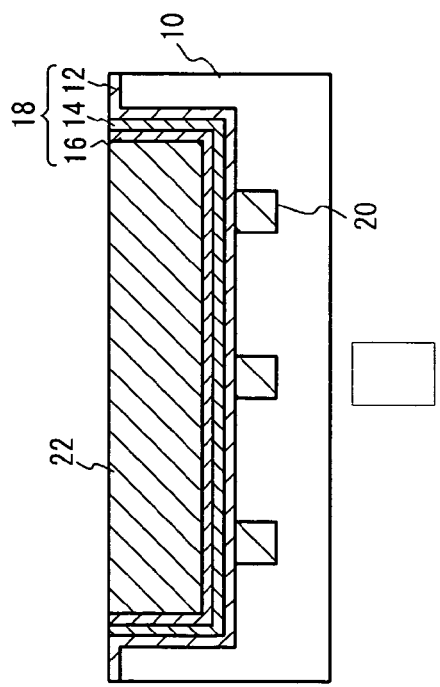
FIG. 17A and FIG. 17B are cross-sectional views illustrating fabrication processes of the flash memory employed in a fifth embodiment of the present invention.
Figure 17B:
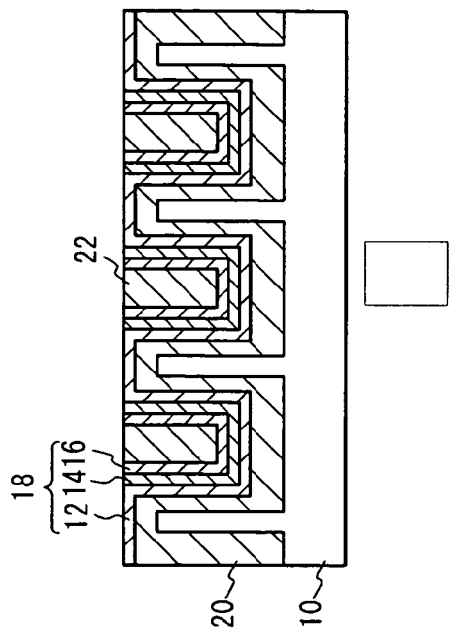

FIG. 17A and FIG. 17B are cross-sectional views showing fabrication processes of the flash memory employed in the fifth embodiment. FIG. 17A and FIG. 17B are cross-sectional views taken along the lines A-A and B-B of FIG. 16A. Subsequent to the fabrication processes similar to those of FIG. 14A through FIG. 14(f) employed in the fourth embodiment, referring to FIG. 17A and FIG. 17B, the top oxide film 16 and the trap layer 14 of the first ONO film 18 on the semiconductor substrate 10 between the trenches 11 are removed by CMP. Then, the fabrication processes are performed in a similar manner as those shown in FIG. 15A through FIG. 15D, and the flash memory employed in the fifth embodiment is completed.

In accordance with the fifth embodiment, the trap layer 14 is not provided on the semiconductor substrate 10 between the trenches 11. Accordingly, it is possible to prevent the charge from storing in the ONO film 18 between the word lines 22, which is resulted from the fringing current. Here, the first ONO film 18 may be removed to the tunnel oxide film 12 between the trenches 11 on the semiconductor substrate 10.

Sixth Embodiment

A sixth embodiment is an example in which two first word lines 22 arranged on the side surfaces of the two first ONO films 18 in an identical trench 11 are isolated from each other. FIG. 18A is a top view of the flash memory employed in the sixth embodiment. FIG. 18B, FIG. 18C, and FIG. 18D are cross-sectional views respectively taken along the lines A-A, B-B, and C-C shown in FIG. 18A. Referring to FIG. 18A, FIG. 18C, and FIG. 18D, an insulation layer 48 is arranged between the two first word lines 22 in the trench 11. This electrically isolates the two first word lines 22. In addition, the insulation layer 48 also isolates the trap layer 14 in the first ONO film 18. Accordingly, as shown in FIG. 18D, the channel is separated into two parts on the both side surfaces of the trench 11. Other configurations are same as those employed in the fourth embodiment, and the same components and configurations as those employed in the fourth embodiment have the same reference numerals and a detailed explanation will be omitted.

Figure 19A:
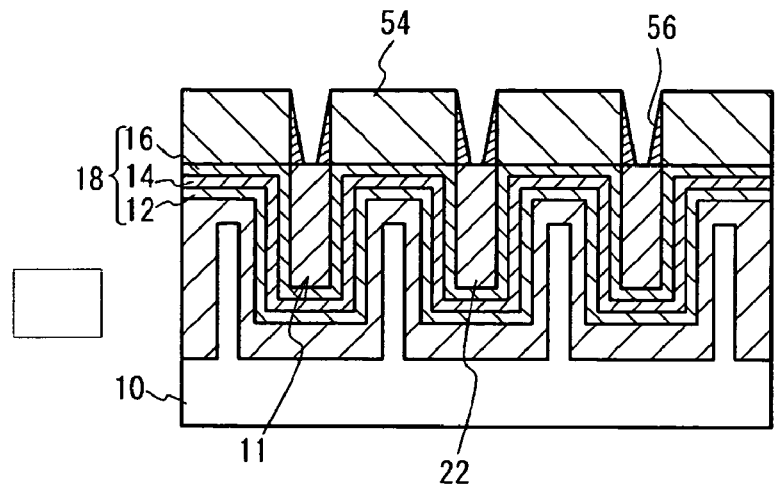
FIG. 19A through FIG. 19C are cross-sectional views illustrating fabrication processes of the flash memory employed in a sixth embodiment of the present invention.
Figure 19B:
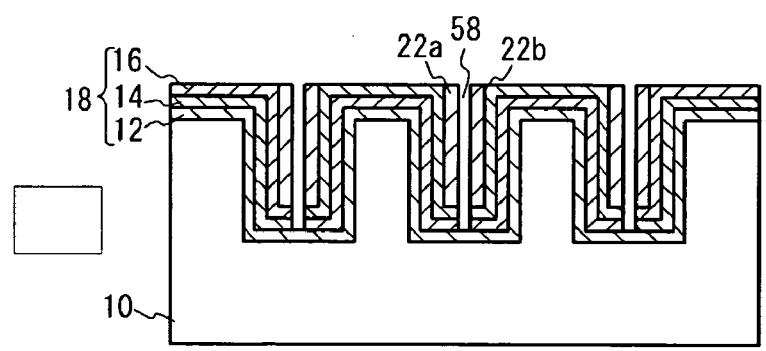
Figure 19C:
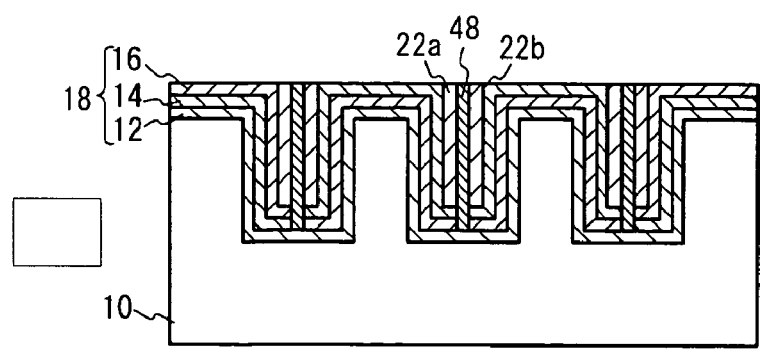

FIG. 19A through FIG. 19C are cross-sectional views showing the fabrication processes of the flash memory employed in the sixth embodiment, taken along the line B-B. Referring to FIG. 19A, subsequent to the processes shown in FIG. 15B and FIG. 15D, a mask layer 54 having openings is formed by providing, for example, a silicon nitride film on the whole surface to remove given regions. Sidewalls 56 of, for example, silicon nitride films are formed at sides of the mask layer 54, by sidewall method. Referring to FIG. 19B, the first word lines 22, the top oxide film 16, and the trap layer 14 are etched by using the mask layer 54 and the sidewalls 56. In this manner, the first word line 22 is separated into two first word lines 22a and 22b, and a trench 58 is formed. The mask layer 54 and the sidewalls 56 are removed. The mask layer 54 and the side walls 56 are formed by the silicon nitride films, thereby making it possible to selectively remove the mask layer 54 and the sidewalls 56 with respect to the top oxide film 16.

Referring to FIG. 19C, a silicon oxide film, for example, is formed in the trench 58 and on the whole surface by a high-density plasma CVD. The silicon oxide film other than that in the trench 58 is removed. By this, the insulation layer 48 embedded in the trench 58 is formed. In this manner, the first word lines 22a and 22b, formed on both side surfaces of the two first ONO films 18 in the trench 11 are electrically isolated from each other by the insulation layer 48. The first contact holes, not shown, connected to a pair of the first word lines 22a and 22b are formed in different positions in a length direction of the trench 11, as a region in which the word line and the wiring layer are connected in a left-hand side of FIG. 1. In a similar manner as the first embodiment, the memory cell of much higher capacity and higher density are realized. Here, the width of the trench 11 is 210 nm, the film thickness of the first ONO film 18 is approximately 30 nm, and the width of the insulation layer 48 is approximately 30 nm. However, the present invention is not limited to the aforementioned sizes.

In the sixth embodiment, since the two first word lines 22 are electrically isolated in an identical trench 11, there are provided two charge storage regions at both side surfaces of the trench 11 in the memory cell Cell in the firs ONO film 18, namely, charge storage regions C21 through C24 are formed in total. In this manner, the charge storage regions are respectively formed on the side surfaces of the trench 11, thereby making it possible to downsize the memory cell. The method of forming a pair of the first word lines 22a and 22b may be the method described with reference to FIG. 6A and FIG. 6B used in the first embodiment or the method described with reference to FIG. 11A through FIG. 12C used in the third embodiment. In addition, the method described with reference to FIG. 19A through FIG. 19C may be employed, instead of FIG. 6A through FIG. 7A used in the first embodiment. In the first through sixth embodiments, a material other than polysilicon may be employed for the first word lines and the second word lines.

Finally, various aspects of the present invention are summarized in the following.

According to a first aspect of the present invention, there is provided a semiconductor device including: trenches formed in a semiconductor substrate; first ONO films provided on both side surfaces of the trenches; and first word lines provided on side surfaces of the first ONO films and running in a length direction of the trenches.

The above-described semiconductor device may further include a second ONO film provided on the semiconductor substrate between the trenches; a second word line provided on the second ONO film, running in the length direction of the trenches, and electrically isolated from the first word lines. Higher memory capacity is realized by providing the ONO film at the side surfaces of the trench and between the trenches on the semiconductor substrate.

The above-described semiconductor device may further include bit lines provided in the semiconductor substrate and running in a width direction of the trenches. The bit lines can be formed with ease.

In the above-described semiconductor device, each of the first ONO films and the second ONO film may have a pair of charge storage regions. Much higher memory capacity is available.

In the above-described semiconductor device, the first ONO films and the second ONO film may have a shared trap layer. The ONO film can be formed ay the side surfaces of the trench in a simple fabrication method.

In the above-described semiconductor device, each of the first ONO films and the second ONO film has a different trap layer. It is possible to prevent the charge from being stored in the ONO film at both sides of the word line.

The above-described semiconductor device may further include an interlayer insulation film provided above the second word line and the trenches, having first contact holes that are connected to the first word lines on top surfaces thereof and a wiring layer. The wiring layer can be connected to the first word line.

In the above-described semiconductor device, each of the first contact holes that is connected to each of a pair of the first word lines provided on both side surfaces of the trenches may be formed at a different position in the length direction of the trenches. A distance between the word lines can be shortened, thereby realizing much higher capacity and density.

In the above-described semiconductor device, the interlayer insulation film may have a second contact hole connected to the second word line; and the second contact hole may be formed at a different position from the first contact holes in the length direction of the trenches. A distance between the first word line and the second word line can be shortened, thereby realizing much higher capacity and density.

In the above-described semiconductor device, the first ONO films formed in the identical trench may be connected on a bottom surface of the trenches so as to form a single ONO film; and the first word lines formed in an identical trench may form a single word line. The effect of charge loss or fringing current can be reduced, thereby allowing the memory cell to be miniaturized.

In the above-described semiconductor device, the first word lines formed in an identical trench may be electrically isolated from each other. Much higher capacity and density is available.

In the above-described semiconductor device, the first ONO films formed on the side surfaces of adjacent trenches may be connected on the semiconductor substrate between the adjacent trenches so as to form a single ONO film.

In the above-described semiconductor device, trap layers in the first ONO films formed on the side surfaces of adjacent trenches may be isolated each other. It is possible to suppress the charge storage in the ONO film between the word lines due to the fringing current.

The above-described semiconductor device may further include an interlayer insulation film provided above the trenches, having first contact holes connected to the first word lines on top surfaces thereof and a wiring layer, and each of the first contact holes connected to each of a pair of the first word lines provided on the both side surfaces of the trenches is formed at a different position in the length direction of the trenches. The distance between the first word lines can be shortened, thereby realizing much higher capacity and density.

According to a second aspect of the present invention, there is provided a method of fabricating a semiconductor device including: forming trenches in a semiconductor substrate; forming first ONO films on both surfaces of the trenches; and forming first word lines, on a side surface of each of the first ONO films in the trenches to run in a length direction of the trenches.

The above-described method may further include: forming a second ONO film on the semiconductor substrate between the trenches; and forming a second word line on the second ONO film to run in the length direction of the trenches and to be electrically isolated from the first word lines. The higher memory density is available by providing the ONO film at the side surfaces of the trench and between the trenches on the semiconductor substrate.

In the above-described method, forming the first ONO films and forming the second ONO film may include forming a shared trap layer of the first ONO films and the second ONO film. The first ONO film can be formed at the side surfaces of the trench in a simple fabrication method.

In the above-described method, forming the first ONO films may include forming first trap layers; and forming the second ONO film may include forming a second trap layer, and forming the first trap layers is a different step from forming the second trap layer. It is possible to suppress the charge storage in the ONO film at both sides of the word line at the time of data writing.

In the above-described method, forming the first ONO films and forming the second ONO film may include forming a top silicon oxide film common to the first ONO films and the second ONO film. The fabrication process can be reduced.

The above-described method may further include forming first contact holes in an interlayer insulation film provided on the second word line and the trenches to be connected to top surfaces of the first word lines. The wiring layer can be connected to the first word line.

In the above-described method, forming the first contact holes may include forming each of the first contact holes that is connected to each of a pair of first word lines provided on both side surfaces of the trenches, at a different position in the length direction of the trenches. The distance between the first word lines can be shortened, thereby realizing much higher capacity and density.

The above-described method may further include forming a second contact hole at a different position of the interlayer insulation film from the first contact holes in the length direction of the trenches, connected to the second word line. The distance between the first word line and the second word line can be shortened, thereby realizing much higher capacity and density.

In the above-described method, forming the first word lines may include: forming a layer to be the first word lines on the side surfaces of the first ONO films and on the second ONO film between the trenches, and removing the layer to be the first word lines between the trenches. The first word line can be formed at the side surfaces of the trench.

In the above-described method, forming the first word lines may include forming a protect layer embedded between regions of the layer to be the first word lines in the trenches.

In the above-described method, removing the layer to be the first word lines may provide the layer to be the first word lines to remain on the side surfaces of the first ONO films and have a same height as a top surface of the protect layer. The height of the first word line can be maintained by using the protection layer as a stopper at the time of removing the layer that should be the first word line.

In the above-described method, removing the layer to be the first word lines may include removing the layer to be the first word lines by polishing the layer. The height of the first word line can be maintained by using the protection layer as a polishing stopper.

The above-described method may further include removing the protect layer.

In the above-described method, forming the first ONO films may include forming an ONO film on the both side surfaces of each of the trenches, on bottom surfaces of the trenches, and on the semiconductor substrate between the trenches. It is possible to form the first ONO film at the both side surfaces of the trench.

The above-described method may further include removing a trap layer in the ONO film on the semiconductor substrate between the trenches. It is possible to suppress the charge storage in the ONO film between the word lines due to the fringing current.

The above-described method may further include electrically isolating the first word lines formed in an identical trench each other. Higher memory capacity is realized.

The above-described method may further include forming first contact holes in an interlayer insulation film provided on the semiconductor substrate between trenches and on the trenches to be connected to top surfaces of the first word lines, wherein forming the first contact holes includes forming each of the first contact holes that is connected to each of a pair of first word lines provided on both side surfaces of the trenches at a different position in the length direction of the trenches. It is possible to shorten the distance between the first word lines, much higher capacity and density is available.

It is possible to provide a semiconductor device and a fabrication method, in which higher memory capacity is enabled.

Embodiments of the present claimed subject matter generally relates to semiconductor devices. More particularly, embodiments allow semiconductor devices to function with increased efficiency. In one implementation, the claimed subject matter is applicable to flash memory and devices that utilize flash memory. Flash memory is a form of non-volatile memory that can be electrically erased and reprogrammed. As such, flash memory, in general, is a type of electrically erasable programmable read only memory (EEPROM).

Like Electrically Erasable Programmable Read Only Memory (EEPROM), flash memory is nonvolatile and thus can maintain its contents even without power. However, flash memory is not standard EEPROM. Standard EEPROMs are differentiated from flash memory because they can be erased and reprogrammed on an individual byte or word basis while flash memory can be programmed on a byte or word basis, but is generally erased on a block basis. Although standard EEPROMs may appear to be more versatile, their functionality requires two transistors to hold one bit of data. In contrast, flash memory requires only one transistor to hold one bit of data, which results in a lower cost per bit. As flash memory costs far less than EEPROM, it has become the dominant technology wherever a significant amount of non-volatile, solid-state storage is needed.

Exemplary applications of flash memory include digital audio players, digital cameras, digital video recorders, and mobile phones. Flash memory is also used in USB flash drives, which are used for general storage and transfer of data between computers. Also, flash memory is gaining popularity in the gaming market, where low-cost fast-loading memory in the order of a few hundred megabytes is required, such as in game cartridges. Additionally, flash memory is applicable to cellular handsets, smartphones, personal digital assistants, set-top boxes, digital video recorders, networking and telecommunication equipments, printers, computer peripherals, automotive navigation devices, and gaming systems.

As flash memory is a type of non-volatile memory, it does not need power to maintain the information stored in the chip. In addition, flash memory offers fast read access times and better shock resistance than traditional hard disks. These characteristics explain the popularity of flash memory for applications such as storage on battery-powered devices (e.g., cellular phones, mobile phones, IP phones, wireless phones.).

Flash memory stores information in an array of floating gate transistors, called "cells", each of which traditionally stores one bit of information. However, newer flash memory devices, such as MirrorBit Flash Technology from Spansion Inc., can store more than 1 bit per cell. The MirrorBit cell doubles the intrinsic density of a Flash memory array by storing two physically distinct bits on opposite sides of a memory cell. Each bit serves as a binary bit of data (e.g., either 1 or 0) that is mapped directly to the memory array. Reading or programming one side of a memory cell occurs independently of whatever data is stored on the opposite side of the cell.

With regards to wireless markets, flash memory that utilizes MirrorBit technology has several key advantages. For example, flash memory that utilizes MirrorBit technology are capable of burst-mode access as fast as 80 MHz, page access times as fast as 25 ns, simultaneous read-write operation for combined code and data storage, and low standby power (e.g., 1 µA).

Figure 20:
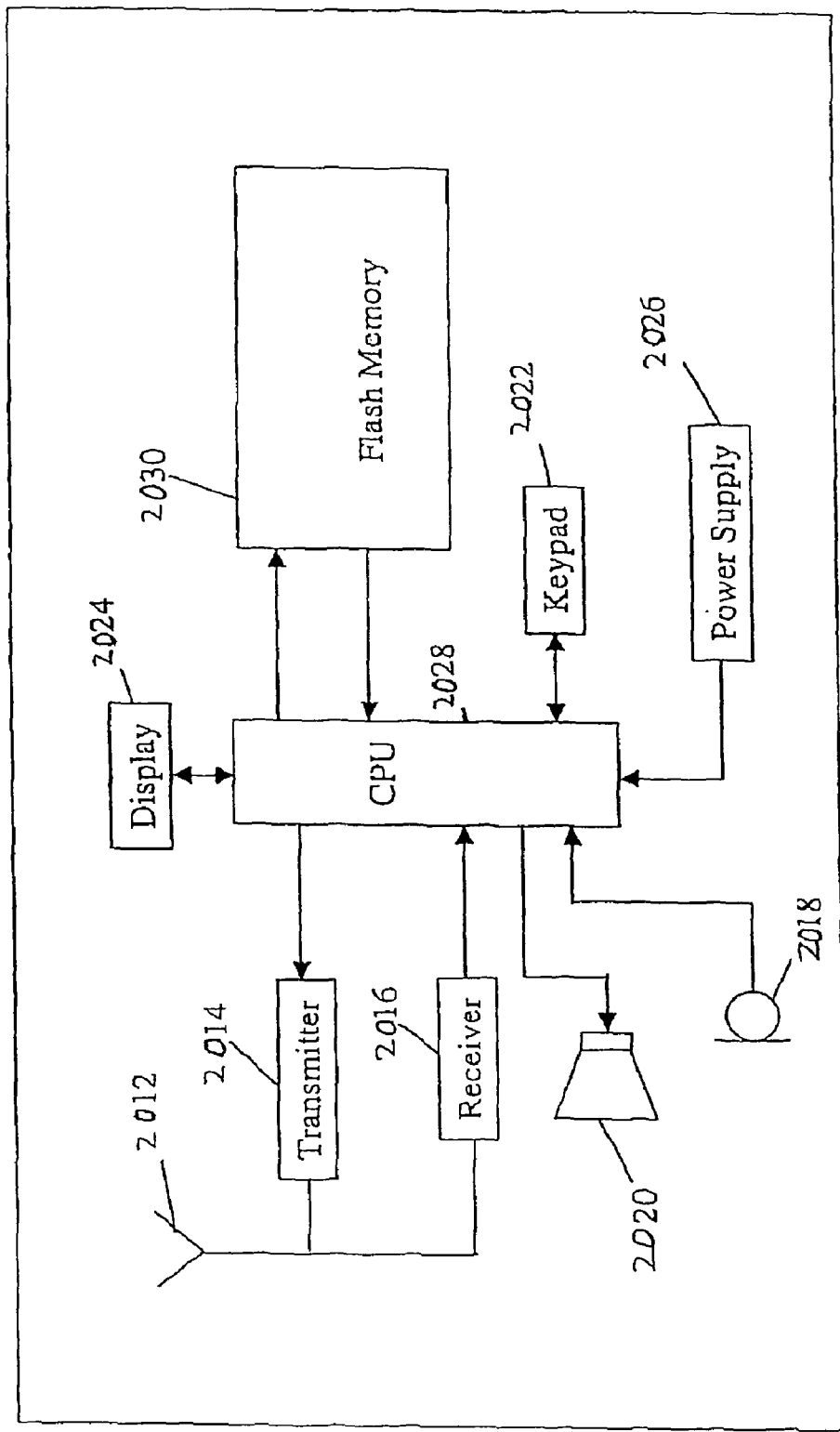
FIG. 20 illustrates a block diagram of a conventional portable phone, upon which embodiments can be implemented.

FIG. 20 shows a block diagram of a conventional portable telephone 2010 (a.k.a. cell phone, cellular phone, mobile phone, internet protocol phone, wireless phone, etc.), upon which embodiments can be implemented. The cell phone 2010 includes an antenna 2012 coupled to a transmitter 2014 a receiver 2016, as well as, a microphone 2018, speaker 2020, keypad 2022, and display 2024. The cell phone 2010 also includes a power supply 2026 and a central processing unit (CPU) 2028, which may be an embedded controller, conventional microprocessor, or the like. In addition, the cell phone 2010 includes integrated, flash memory 2030. Flash memory 2030 includes: trenches formed in a semiconductor substrate; first ONO films provided on both side surfaces of the trenches; and first word lines provided on side surfaces of the first ONO films and running in a length direction of the trenches. In this way, embodiments provide a higher memory capacity. This improvement can translate into memory capacity increase for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Flash memory comes in two primary varieties, NOR-type flash and NAND-type flash. While the general memory storage transistor is the same for all flash memory, it is the interconnection of the memory cells that differentiates the designs. In a conventional NOR-type flash memory, the memory cell transistors are connected to the bit lines in a parallel configuration, while in a conventional NAND-type flash memory, the memory cell transistors are connected to the bit lines in series. For this reason, NOR-type flash is sometimes referred to as "parallel flash" and NAND-type flash is referred to as "serial flash."

Traditionally, portable phone (e.g., cell phone) CPUs have needed only a small amount of integrated NOR-type flash memory to operate. However, as portable phones (e.g., cell phone) have become more complex, offering more features and more services (e.g., voice service, text messaging, camera, ring tones, email, multimedia, mobile TV, MP3, location, productivity software, multiplayer games, calendar, and maps.), flash memory requirements have steadily increased. Thus, a more efficient flash memory will render a portable phone more competitive in the telecommunications market.

Also, as mentioned above, flash memory is applicable to a variety of devices other than portable phones. For instance, flash memory can be utilized in personal digital assistants, set-top boxes, digital video recorders, networking and telecommunication equipments, printers, computer peripherals, automotive navigation devices, and gaming systems.

Figure 21:
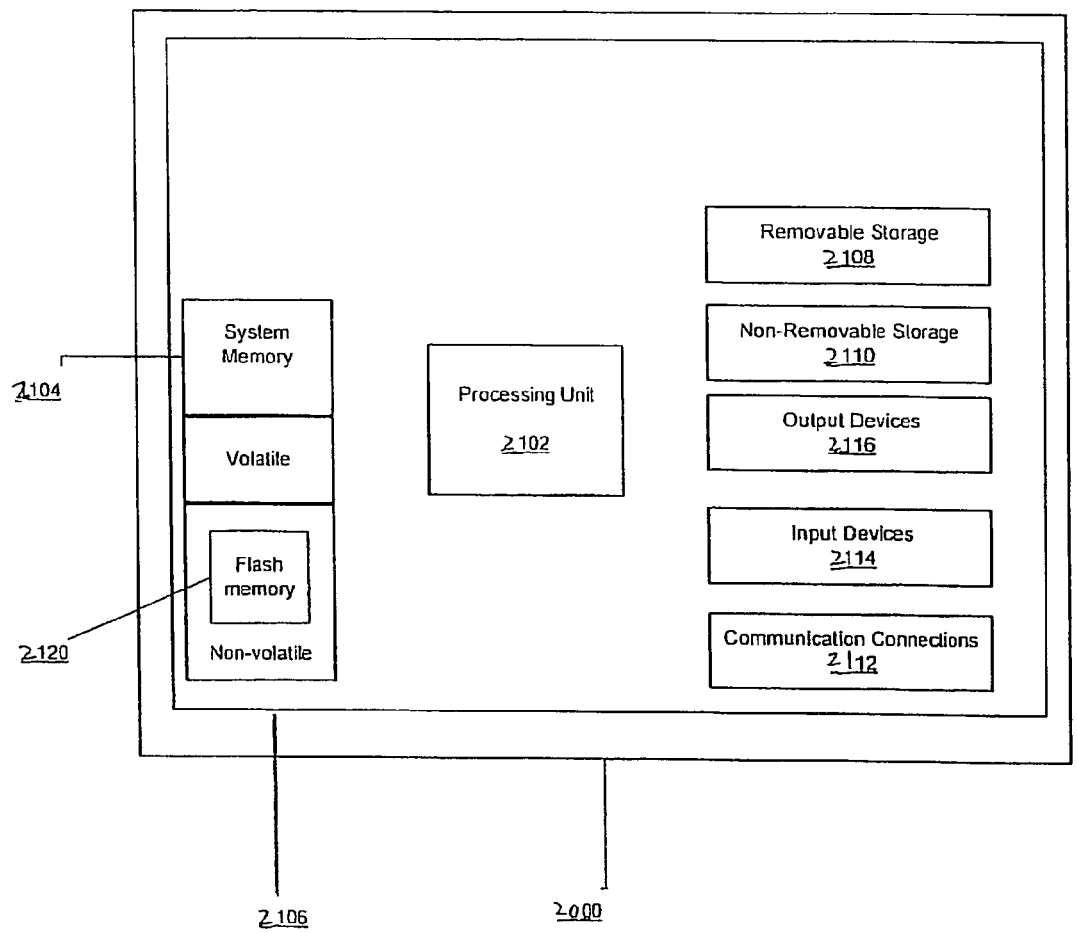
FIG. 21 illustrates a block diagram of a computing device, upon which embodiments of the present claimed subject matter can be implemented.

FIG. 21 illustrates a block diagram of a computing device 2100, upon which embodiments of the present claimed subject matter can be implemented. Although computing device 2100 is shown and described in FIG. 21 as having certain numbers and types of elements, the embodiments are not necessarily limited to the exemplary implementation. That is, computing device 2100 can include elements other than those shown, and can include more than one of the elements that are shown. For example, computing device 2100 can include a greater number of processing units than the one (processing unit 2102) shown. Similarly, in another example, computing device 2100 can include additional components not shown in FIG. 21.

Also, it is important to note that the computing device 2100 can be a variety of things. For example, computing device 2100 can be but are not limited to a personal desktop computer, a portable notebook computer, a personal digital assistant (PDA), and a gaming system. Flash memory is especially useful with small-form-factor computing devices such as PDAs and portable gaming devices. Flash memory offers several advantages. In one example, flash memory is able to offer fast read access times while at the same time being able to withstand shocks and bumps better than standard hard disks. This is important as small computing devices are often moved around and encounters frequent physical impacts. Also, flash memory is more able than other types of memory to withstand intense physical pressure and/or heat. And thus, portable computing devices are able to be used in a greater range of environmental variables.

In its most basic configuration, computing device 2100 typically includes at least one processing unit 2102 and memory 2104. Depending on the exact configuration and type of computing device, memory 2104 may be volatile (such as RAM), non-volatile (such as ROM, flash memory, etc.) or some combination of the two. This most basic configuration of computing device 2100 is illustrated in FIG. 21 by line 2106. Additionally, device 2100 may also have additional features/functionality. For example, device 2100 may also include additional storage (removable and/or non-removable) including, but not limited to, magnetic or optical disks or tape. In one example, in the context of a gaming system, the removable storage could a game cartridge receiving component utilized to receive different game cartridges. In another example, in the context of a Digital Video Disc (DVD) recorder, the removable storage is a DVD receiving component utilized to receive and read DVDs. Such additional storage is illustrated in FIG. 21 by removable storage 2108 and non-removable storage 2110. Computer storage media includes volatile and nonvolatile, removable and non-removable media implemented in any method or technology for storage of information such as computer readable instructions, data structures, program modules or other data. Memory 2104, removable storage 2108 and non-removable storage 2110 are all examples of computer storage media. Computer storage media includes, but is not limited to, RAM, ROM, EEPROM, flash memory 2120 or other memory technology, CD-ROM, digital video disks (DVD) or other optical storage, magnetic cassettes, magnetic tape, magnetic disk storage or other magnetic storage devices, or any other medium which can be used to store the desired information and which can accessed by device 2100. Any such computer storage media may be part of device 2100.

In the present embodiment, the flash memory 2120 comprises: trenches formed in a semiconductor substrate; first ONO films provided on both side surfaces of the trenches; and first word lines provided on side surfaces of the first ONO films and running in a length direction of the trenches. In this way, embodiments provide a higher memory capacity. This improvement can translate into memory capacity increase for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

Further, in one embodiment, the flash memory 2120 utilizes mirrorbit technology to allow storing of two physically distinct bits on opposite sides of a memory cell.

Device 2100 may also contain communications connection(s) 2112 that allow the device to communicate with other devices. Communications connection(s) 2112 is an example of communication media. Communication media typically embodies computer readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. The term computer readable media as used herein includes both storage media and communication media.

Device 2100 may also have input device(s) 2114 such as keyboard, mouse, pen, voice input device, game input device (e.g., a joy stick, a game control pad, and/or other types of game input device), touch input device, etc. Output device(s) 2116 such as a display (e.g., a computer monitor and/or a projection system), speakers, printer, network peripherals, etc., may also be included. All these devices are well know in the art and need not be discussed at length here.

Aside from mobile phones and portable computing devices, flash memory is also widely used in portable multimedia devices, such as portable music players. As users would desire a portable multimedia device to have as large a storage capacity as possible, an increase in memory density would be advantageous. Also, users would also benefit from reduced memory read time.

Figure 22:
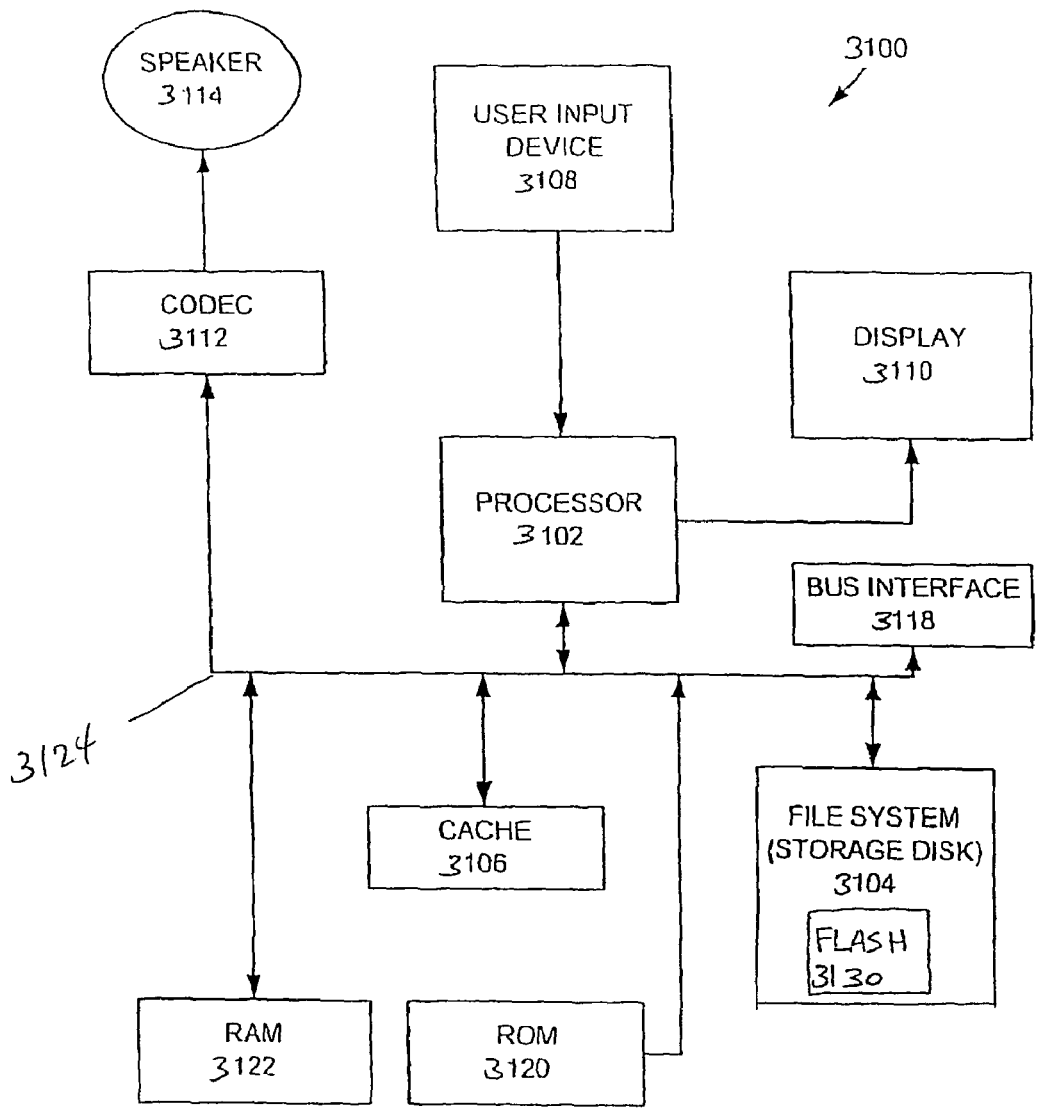
FIG. 22 illustrates an exemplary portable multimedia device, or media player, in accordance with an embodiment of the present claimed subject matter.

FIG. 22 shows an exemplary portable multimedia device, or media player, 3100 in accordance with an embodiment of the invention. The media player 3100 includes a processor 3102 that pertains to a microprocessor or controller for controlling the overall operation of the media player 3100. The media player 3100 stores media data pertaining to media assets in a file system 3104 and a cache 3106. The file system 3104 is, typically, a storage disk or a plurality of disks. The file system 3104 typically provides high capacity storage capability for the media player 3100. Also, file system 3104 includes flash memory 3130. In the present embodiment, the flash memory 3130 comprises: trenches formed in a semiconductor substrate; first ONO films provided on both side surfaces of the trenches; and first word lines provided on side surfaces of the first ONO films and running in a length direction of the trenches. In this way, embodiments provide a higher memory capacity. This improvement can translate into memory capacity increase for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

However, since the access time to the file system 3104 is relatively slow, the media player 3100 can also include a cache 3106. The cache 3106 is, for example, Random-Access Memory (RAM) provided by semiconductor memory. The relative access time to the cache 3106 is substantially shorter than for the file system 3104. However, the cache 3106 does not have the large storage capacity of the file system 3104. Further, the file system 3104, when active, consumes more power than does the cache 3106. The power consumption is particularly important when the media player 3100 is a portable media player that is powered by a battery (not shown). The media player 3100 also includes a RAM 3120 and a Read-Only Memory (ROM) 3122. The ROM 3122 can store programs, utilities or processes to be executed in a non-volatile manner. The RAM 3120 provides volatile data storage, such as for the cache 3106.

The media player 3100 also includes a user input device 3108 that allows a user of the media player 3100 to interact with the media player 3100. For example, the user input device 3108 can take a variety of forms, such as a button, keypad, dial, etc. Still further, the media player 3100 includes a display 3110 (screen display) that can be controlled by the processor 3102 to display information to the user. A data bus 3124 can facilitate data transfer between at least the file system 3104, the cache 3106, the processor 3102, and the CODEC 3110. The media player 3100 also includes a bus interface 3116 that couples to a data link 3118. The data link 3118 allows the media player 3100 to couple to a host computer.

In one embodiment, the media player 3100 serves to store a plurality of media assets (e.g., songs) in the file system 3104. When a user desires to have the media player play a particular media item, a list of available media assets is displayed on the display 3110. Then, using the user input device 3108, a user can select one of the available media assets. The processor 3102, upon receiving a selection of a particular media item, supplies the media data (e.g., audio file) for the particular media item to a coder/decoder (CODEC) 3110. The CODEC 3110 then produces analog output signals for a speaker 3114. The speaker 3114 can be a speaker internal to the media player 3100 or external to the media player 3100. For example, headphones or earphones that connect to the media player 3100 would be considered an external speaker.

For example, in a particular embodiment, the available media assets are arranged in a hierarchical manner based upon a selected number and type of groupings appropriate to the available media assets. For example, in the case where the media player 3100 is an MP3 type media player, the available media assets take the form of MP3 files (each of which corresponds to a digitally encoded song or other audio rendition) stored at least in part in the file system 3104. The available media assets (or in this case, songs) can be grouped in any manner deemed appropriate. In one arrangement, the songs can be arranged hierarchically as a list of music genres at a first level, a list of artists associated with each genre at a second level, a list of albums for each artist listed in the second level at a third level, while at a fourth level a list of songs for each album listed in the third level, and so on.

Referring to FIG. 23, the internal configuration of a digital camera 3001 is described. FIG. 23 is a block diagram showing the internal functions of the digital camera 3001. The CCD (image capturing device) 3020 functions as image capturing means for capturing a subject image and generating an electronic image signal and has, for example, 1600 times 1200 pixels. The CCD 3020 photoelectrically converts a light image of the subject formed by the taking lens into image signals (signal made of a signal sequence of pixel signals received by the pixels) of R (red), G (green) and B (blue) pixel by pixel and outputs the image signal.

The image signal obtained from the CCD 3020 is supplied to an analog signal processing circuit 3021. In the analog signal processing circuit 3021, the image signal (analog signal) is subjected to a predetermined analog signal process. The analog signal processing circuit 3021 has a correlated double sampling circuit (CDS) and an automatic gain control circuit (AGC) and adjusts the level of the image signal by performing a process of reducing noise in the image signal by the correlated double sampling circuit and adjusting the gain by the automatic gain control circuit.

An A/D converter 3022 converts each of pixel signals of the image signal into a digital signal of 12 bits. The digital signal obtained by the conversion is temporarily stored as image data in a buffer memory 3054 in a RAM 3050a. The image data stored in the buffer memory 3054 is subjected to WB (white balance) process, gamma correction process, color correction process and the like by an image processing unit 3051 and, after that, the processed signal is subjected to a compressing process or the like by a compressing/decompressing unit 3052.

A sound signal obtained from the microphone 3012 is inputted to a sound processing unit 3053. The sound signal inputted to the sound processing unit 3053 is converted into a digital signal by an A/D converter (not shown) provided in the sound processing unit 3053 and the digital signal is temporarily stored in the buffer memory 3054.

An operation unit is an operation unit that can include a power source button and a shutter release button and is used when the user performs an operation of changing a setting state of the digital camera 3001 and an image capturing operation.

A power source 3040 is a power supply source of the digital camera 3001. The digital camera 3001 is driven by using a secondary battery such as a lithium ion battery as the power source battery BT.

An overall control unit 3050 is constructed by a microcomputer having therein the RAM 3050a and a ROM 3050b. When the microcomputer executes a predetermined program, the overall control unit 3050 functions as a controller for controlling the above-described components in a centralized manner. The overall control unit 3050 also controls, for example, a live view display process and a process of recording data to a memory card. The RAM 3050a is a semiconductor memory (such as DRAM) which can be accessed at high speed and the ROM 3050b takes the form of, for example, an electrically-rewritable nonvolatile semiconductor memory (such as flash ROM 3050c). A flash memory, in one embodiment, includes: trenches formed in a semiconductor substrate; first ONO films provided on both side surfaces of the trenches; and first word lines provided on side surfaces of the first ONO films and running in a length direction of the trenches. In this way, embodiments provide a higher memory capacity. This improvement can translate into memory capacity increase for various devices, such as personal digital assistants, set-top boxes, digital video recorders, networking and telecommunication equipments, printers, computer peripherals, automotive navigation devices, gaming systems, mobile phones, cellular phones, internet protocol phones, and/or wireless phones.

An area as a part of the RAM 3050a functions as a buffer area for temporary storing data. This buffer area is referred to as the buffer memory 3054. The buffer memory 3054 temporarily stores image data and sound data.

The overall control unit 3050 has the image processing unit 3051, compressing/decompressing unit 3052 and sound processing unit 3053. The processing units 3051, 3052 and 3053 are function parts realized when the microcomputer executes a predetermined program.

The image processing unit 3051 is a processing unit for performing various digital imaging processes such as WB process and gamma correcting process. The WB process is a process of shifting the level of each of the color components of R, G and B and adjusting color balance. The gamma correcting process is a process of correcting the tone of pixel data. The compressing/decompressing unit 3052 is a processing unit for performing an image data compressing process and an image data decompressing process. As the compressing method, for example, the JPEG method is employed. The sound processing unit 3053 is a processing unit for performing various digital processes on sound data.

A card interface (I/F) 3060 is an interface for writing/reading image data to/from the memory card 3090 inserted into the insertion port in the side face of the digital camera 1. At the time of reading/writing image data from/to the memory card 3090, the process of compressing or decompressing image data is performed according to, for example, the JPEG method in the compressing/decompressing unit 3052, and image data is transmitted/received between the buffer memory 3054 and the memory card 3090 via the card interface 3060. Also at the time of reading/writing sound data, sound data is transmitted/received between the buffer memory 3054 and the memory card 3090 via the card interface 3060.

Further, by using the card interface 3060, the digital camera 3001 transmits/receives data such as an image and sound and, in addition, can load a program which operates on the digital camera 3001. For example, a control program recorded on the memory card 3090 can be loaded into the RAM 3050a or ROM 3050b of the overall control unit 3050. In such a manner, the control program can be updated.

Also by communication with an external device (such as an external computer) via a USB terminal, various data such as an image and sound and a control program can be transmitted/received. For example, various data, a program, and the like recorded on a recording medium (CD-R/RW or CD-ROM) which is set into a reader (optical drive device or the like) of the external computer can be obtained via the USB terminal.

Although a few embodiments of the present invention have been shown and described, it would be appreciated by those skilled in the art that changes may be made in these embodiments without departing from the principles and spirit of the invention, the scope of which is defined in the claims and their equivalents. The non-volatile semiconductor memory device has been described in the above-mentioned embodiments as an example. However, the present invention is applicable to a semiconductor device having the non-volatile semiconductor memory device mounted thereon.

The invention claimed is:

1. A semiconductor device comprising:
a semiconductor substrate;
trenches formed in said semiconductor substrate;
an ONO film comprising first ONO film portions that are formed in said trenches and second ONO film portions that are formed on the surface of said semiconductor substrate;
first word lines that are formed inside said trenches, wherein said first word lines extend in a direction that is parallel to respective side surfaces of said first ONO film portions and to respective side surfaces of said trenches; and
bit lines that are provided in said semiconductor substrate that extend in a direction that is orthogonal to the direction in which side surfaces of said trenches extend.

2. The semiconductor device of claim 1, wherein said first ONO film portions and said second ONO film portions have charge storage regions.

3. The semiconductor device of claim 1, wherein said first ONO film portions and said second ONO film portions have a shared trap layer.

4. The semiconductor device of claim 1, wherein said first ONO film portions and said second ONO film portions have separate trap layers.

5. The semiconductor device of claim 1, further comprising:
second word lines;
an interlayer insulation film provided above said second word lines and said trenches, wherein said interlayer insulation film comprises first contact holes for connecting said first word lines to a wiring layer.

6. The semiconductor device of claim 5, wherein said first contact holes provide access to respective ones of said first word lines at different positions in a direction that is parallel to said side surfaces of said trenches.

7. The semiconductor device of claim 5, wherein said interlayer insulation film comprises second contact holes that provide access to said second word lines wherein said second contact holes are formed at different positions from said first contact holes in a direction that is parallel to said side surfaces of said trenches.

8. The semiconductor device of claim 1, wherein said first ONO film portions comprise portions that are formed on bottom surfaces of said trenches and wherein said first word lines form a single word line in said trenches.

9. The semiconductor device of claim 1, wherein said first word lines are electrically isolated from each other in said trenches.

10. The semiconductor device of claim 9, further comprising:
second word lines;
an interlayer insulation film provided above said second word lines and said trenches, wherein said interlayer insulation film comprises first contact holes for connecting said first word lines to a wiring layer.

11. The semiconductor device of claim 1, wherein said first ONO film portions are coupled on said semiconductor substrate via said second ONO film portions between adjacent trenches to form a single ONO film.

12. The semiconductor device of claim 1, further comprising trap layers formed in said first ONO film portions wherein said trap layers are formed on side surfaces of adjacent trenches and are isolated from each other.

13. A method of fabricating a semiconductor device comprising:
    forming a semiconductor substrate;
    forming trenches in said semiconductor substrate;
    forming an ONO film comprising forming first ONO film portions in said trenches and forming second ONO film portions on the surface of said semiconductor substrate; and
    forming first word lines inside said trenches to extend in a direction that is parallel to respective side surfaces of said first ONO film portions and to respective side surfaces of said trenches;
    forming a second word line;
    forming an interlayer insulation film above said second word line;
    forming first contact holes in said interlayer insulation film that provide access to the top surfaces of said first word lines; and
    forming a second contact hole for contacting said second word line at a position of said interlayer insulation film different from the positions of said first contact holes, in a direction that is parallel to said side surfaces of said trenches.

14. The method of claim 13, wherein forming said ONO film comprises forming a shared trap layer for said first ONO film portions and said second ONO film portions.

15. The method of claim 14, further comprising removing portions of said trap layer in said ONO film on said surface of said semiconductor substrate between said trenches.

16. The method of claim 13, wherein forming said ONO film comprises forming trap layers for said first ONO film portions and said second ONO film portions in different operations.

17. The method of claim 16, wherein forming said ONO film comprises forming a top silicon oxide film that is common to said first ONO film portions and said second ONO film portions.

18. The method of claim 13, wherein said forming said first contact holes comprises forming respective contact holes for contacting each of a pair of first word lines located adjacent respective side surfaces of said trenches, wherein said respective first contact holes are formed at different positions in a direction that is parallel to said side surfaces of said trenches.

19. The method of claim 13, wherein said forming said first word lines comprises:
    forming a layer from which said first word lines are formed on side surfaces of said first ONO film portions and on said second ONO film portions that are located between said trenches, and
    removing portions of said layer from which said first word lines are formed that are located between said trenches.

20. The method of claim 19, wherein said forming said first word lines comprises forming a protect layer that is embedded between regions of said layer from which said first word lines are formed.

21. The method of claim 20, wherein said removing portions of said layer from which said first word lines is formed comprises allowing said layer from which said first word lines is formed to remain on said side surfaces of said first ONO film portions at the same height as a top surface of said protect layer.

22. The method of claim 20, further comprising removing said protect layer.

23. The method of claim 19, wherein said removing portions of said layer from which said first word lines are formed includes removing portions of said layer from which said first word lines are formed by polishing.

24. The method of claim 13, wherein said forming said first ONO film includes forming ONO film portions on both side surfaces said trenches, on the bottom surfaces of said trenches, and on said semiconductor substrate between said trenches.

25. The method of claim 13, further comprising electrically isolating said first word lines from each other.

26. The method of claim 25, further comprising:
    forming and interlayer insulation film above said semiconductor substrate; and
    forming first contact holes in said interlayer insulation film between said trenches for contacting top surfaces of said first word lines, wherein forming said first contact holes comprises forming respective ones of said first contact holes at a different position in a direction that is parallel to said trenches.

* * * * *